(12) United States Patent
Yoon et al.

(10) Patent No.: US 12,185,486 B2
(45) Date of Patent: Dec. 31, 2024

(54) DISPLAY DEVICE AND ELECTRONIC DEVICE INCLUDING THE SAME

(71) Applicant: Samsung Display Co., Ltd., Yongin-si (KR)

(72) Inventors: Dongho Yoon, Anyang-si (KR); Hun-Tae Kim, Seoul (KR); Hyeyoung Nam, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 308 days.

(21) Appl. No.: 17/737,457

(22) Filed: May 5, 2022

(65) Prior Publication Data

US 2022/0377922 A1 Nov. 24, 2022

(30) Foreign Application Priority Data

May 21, 2021 (KR) .................. 10-2021-0065528
Jun. 18, 2021 (KR) .................. 10-2021-0079074

(51) Int. Cl.
| | | |
|---|---|---|
| H05K 5/00 | (2006.01) | |
| H05K 5/03 | (2006.01) | |
| H10K 50/844 | (2023.01) | |
| H05K 7/20 | (2006.01) | |
| H10K 59/122 | (2023.01) | |
| H10K 102/00 | (2023.01) | |

(52) U.S. Cl.
CPC ............ *H05K 5/03* (2013.01); *H05K 5/0017* (2013.01); *H10K 50/844* (2023.02); *H05K 7/20963* (2013.01); *H10K 59/122* (2023.02); *H10K 2102/311* (2023.02)

(58) Field of Classification Search
None
See application file for complete search history.

(56) References Cited

U.S. PATENT DOCUMENTS

| | | | |
|---|---|---|---|
| 10,490,769 B2 | 11/2019 | Min | |
| 11,164,917 B1 * | 11/2021 | Wang | ............. H10K 59/40 |
| 11,405,725 B2 * | 8/2022 | Park | ............. H04R 1/1041 |
| 2019/0384435 A1 | 12/2019 | Tsai et al. | |
| 2020/0176705 A1 | 6/2020 | Lee et al. | |
| 2022/0141969 A1 * | 5/2022 | Cho | ............. G06F 3/0443 |
| | | | 361/807 |

FOREIGN PATENT DOCUMENTS

| | | |
|---|---|---|
| KR | 100954894 B1 | 4/2010 |
| KR | 1020130012698 A | 2/2013 |
| KR | 1020170084403 A | 7/2017 |
| KR | 1020200068139 A | 6/2020 |
| KR | 1020200115092 A | 10/2020 |
| KR | 1020210022330 A | 3/2021 |

* cited by examiner

*Primary Examiner* — Stephen W Jackson
(74) *Attorney, Agent, or Firm* — CANTOR COLBURN LLP

(57) ABSTRACT

A display device includes a display module, on which a display area and a non-display area are defined, and a window module disposed on the display module. The window module includes a first window, a second window disposed under the first window, and a bezel pattern overlapping the non-display area. When viewed from a plan view in a thickness direction of the display device, at least a portion of an edge of the second window does not overlap the bezel pattern.

26 Claims, 23 Drawing Sheets

DISPLAY DEVICE AND ELECTRONIC DEVICE INCLUDING THE SAME

This application claims priority to Korean Patent Application Nos. 10-2021-0065528, filed on May 21, 2021, and 10-2021-0079074, filed on Jun. 18, 2021, and all the benefits accruing therefrom under 35 U.S.C. § 119, the contents of which in their entireties are herein incorporated by reference.

BACKGROUND

1. Field

The disclosure herein relates to an electronic device, and more particularly, to a foldable electronic device.

2. Description of the Related Art

An electronic device such as smartphones, digital cameras, laptop computers, navigations, and smart televisions, which provide an image to a user, typically includes a display device for displaying an image. The display device generates an image to provide the image to the user through a display screen.

In recent years, a display device having various shapes is being developed with the advance in technologies. For example, a flexible display device that is foldable or rollable is being developed. The flexible display device having a changeable shape may be easily carried, thereby improving user's convenience.

The display device may include a display panel, a window disposed on the display panel, and a window protection layer disposed on the window.

An electronic device may further include a display device and a functional module.

SUMMARY

Embodiments of a display device according to the invention may allow a state of a window edge to be inspected from an outside of the display device.

Embodiments of an electronic device including the display device according to the invention may be improved in reliability.

An embodiment of the invention provides a display device including: a display module on which a display area and a non-display area are defined; and a window module disposed on the display module, where the window module includes: a first window; a second window disposed under the first window; and a bezel pattern overlapping the non-display area. In such an embodiment, when viewed from a plan view in a thickness direction of the display device, at least a portion of an edge of the second window does not overlap the bezel pattern.

In an embodiment, the first window may have a length greater than a length of the second window in a first direction.

In an embodiment, a folding area and a non-folding area may be defined on the display module, the bezel pattern may include a first bezel pattern overlapping the folding area and a second bezel pattern overlapping the non-folding area, and when viewed from the plan view in the thickness direction of the display device, the first bezel pattern may not overlap the edge of the second window, and the second bezel pattern may overlap the edge of the second window.

In an embodiment, the first bezel pattern may have a width less than a width of the second bezel pattern.

In an embodiment, the first bezel pattern and the second bezel pattern may be integrally formed with each other as a single unitary unit.

In an embodiment, the first bezel pattern may include a first outer edge and a first inner edge, the second bezel pattern may include a second outer edge and a second inner edge, and when viewed from the plan view in the thickness direction of the display device, the first inner edge and the second inner edge may be disposed inwardly from the edge of the second window.

In an embodiment, when viewed from the plan view in the thickness direction of the display device, the first outer edge may be disposed inwardly from the edge of the second window, and the second outer edge may be disposed outwardly from the edge of the second window.

In an embodiment, the bezel pattern may be disposed between the first window and the second window.

In an embodiment, the display device may further include an adhesive layer disposed between the first window and the second window.

In an embodiment, the bezel pattern may be disposed between the first window and the adhesive layer.

In an embodiment, the bezel pattern may be disposed between the adhesive layer and the second window.

In an embodiment, the second window may have a thickness in a range of about 15 micrometers (μm) to about 100 μm.

In an embodiment, the first window may include at least one selected from polyimide ("PI"), polyethylene ("PE"), polyurethane ("PU"), and Triacetylcellulose ("TAC").

In an embodiment, the second window may include a chemically tempered glass substrate.

In an embodiment, the display device may further include a support part disposed under the display module, where the support part may include: a first plate disposed under the display module; a cover layer disposed under the first plate; a second plate disposed under the cover layer; a heat dissipation layer disposed between the first plate and the second plate; and a step compensation layer disposed the cover layer and the second plate and around an edge of the heat dissipation layer.

In an embodiment of the invention, a display device includes: a display module on which a folding area and a non-folding area are defined; a window protection layer disposed on the display module; a window base layer disposed between the window protection layer and the display module; and a bezel pattern disposed under the window protection layer, where the bezel pattern includes a first bezel pattern overlapping the folding area and a second bezel pattern overlapping the non-folding area. In such an embodiment, when viewed from a plan view in a thickness direction of the display device, the first bezel pattern does not overlap an edge of the window base layer, and the second bezel pattern overlap the edge of the window base layer.

In an embodiment, the window protection layer may include: a first portion which overlaps the window base layer on the plane when viewed from the plan view in the thickness direction of the display device; and a second portion which extends from the first portion and does not overlap the window base layer on the plane when viewed from the plan view in the thickness direction of the display device, where when viewed from the plan view in the thickness direction of the display device, the first bezel pattern may overlap the first portion and does not overlap the second portion, and the second bezel pattern may overlap the first portion and the second portion.

In an embodiment of the invention, a display device includes: a display module on which a folding area and a non-folding area are defined; a window module disposed on the display module, where the window module includes: a window protection layer; a bezel pattern disposed under the window protection layer; and a thin film glass substrate disposed under the bezel pattern, where the window protection layer includes: a first portion overlapping the thin film glass substrate when viewed from a plan view in a thickness direction of the display device; and a second portion which extends from the first portion and does not overlap the thin film glass substrate when viewed from the plan view in the thickness direction of the display device, where the bezel pattern includes: a first bezel pattern overlapping the first portion and the folding area when viewed from the plan view in the thickness direction of the display device; and a second bezel pattern overlapping the first portion, the second portion, and the non-folding area when viewed from the plan view in the thickness direction of the display device.

In an embodiment, the first bezel pattern may include a first outer edge and a first inner edge, the second bezel pattern may include a second outer edge and a second inner edge, and when viewed from the plan view in the thickness direction of the display device, the first inner edge may be aligned with the second inner edge.

In an embodiment, when viewed from the plan view in the thickness direction of the display device, the first outer edge may be disposed inwardly from an edge of the thin film glass substrate, and the second outer edge is aligned with an edge of the window protection layer.

In an embodiment of the invention, an electronic device includes: a display device including a first signal area, through which an optical signal passes, and a display area adjacent to the first signal area; and an electronic module disposed under the display device and overlapping the first signal area, where to the electronic module receives the optical signal, where the display device includes: a display module on which a display area and a non-display area are defined; and a window module disposed on the display module, where the window module includes: a first window; a second window disposed under the first window; and a bezel pattern overlapping the non-display area, where, when viewed from a plan view in a thickness direction of the display device, at least a portion of an edge of the second window does not overlap the bezel pattern.

In an embodiment, the electronic module may include at least one selected from a camera module and a sensor module.

In an embodiment, a first non-folding area, a second non-folding area, and a folding area disposed between the first non-folding area and the second non-folding area may be defined on the display module, the bezel pattern may include a first bezel pattern overlapping the folding area and a second bezel pattern overlapping the first non-folding area or the second non-folding area, and when viewed from the plan view in the thickness direction of the display device, the first bezel pattern may not overlap the edge of the second window, and the second bezel pattern may overlap the edge of the second window.

In an embodiment, the first bezel pattern may have a width less than a width of the second bezel pattern.

In an embodiment, the first bezel pattern may include a first outer edge and a first inner edge, the second bezel pattern may include a second outer edge and a second inner edge, and when viewed from the plan view in the thickness direction of the display device, the first inner edge and the second inner edge may be disposed inwardly from the edge of the second window.

In an embodiment, when viewed from the plan view in the thickness direction of the display device, the first outer edge may be disposed inwardly from the edge of the second window, and the second outer edge may be disposed outwardly from the edge of the second window.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1:
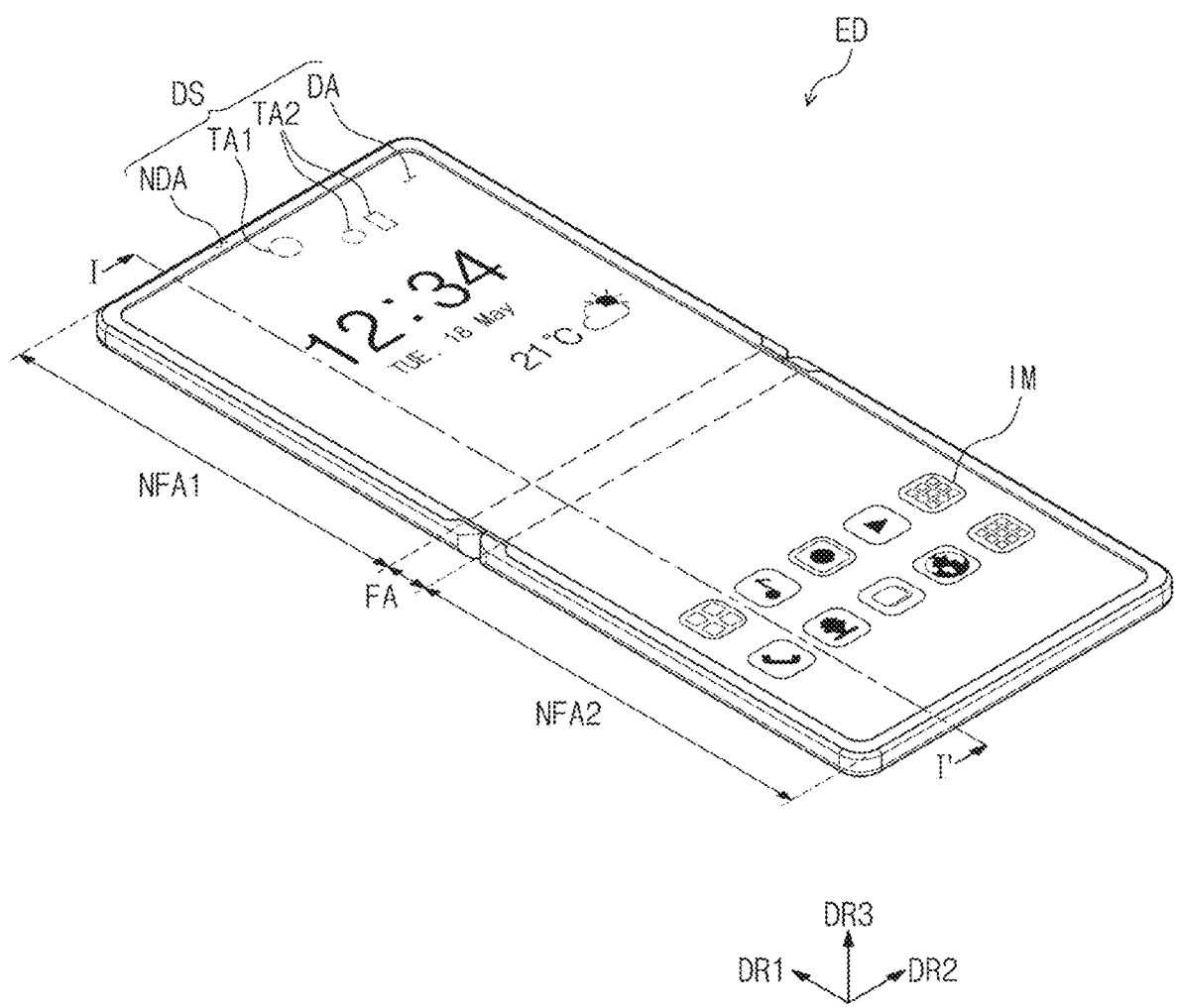
FIG. 1 is a perspective view illustrating coupling of an electronic device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, it will also be understood that when one component (or area, layer, portion) is referred to as being 'on', 'connected to', or 'coupled to' another component, it can be directly disposed/connected/coupled on/to the one component, or an intervening third component may also be present.

Like reference numerals refer to like elements throughout. In addition, in the drawings, thicknesses, ratios, and dimensions of components are exaggerated for effective description of the technical content.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting to "a" or "an." "Or" means "and/or." As used herein, the term "and/or" includes any and all combinations of one or more of the associated listed items. It will be further understood that the terms "comprises" and/or "comprising" or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath" "below" "lower" "above" "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein should be interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by a person of ordinary skill in the art to which this invention belongs. In addition, terms such as those defined in commonly used dictionaries should be interpreted as having a meaning consistent with the meaning in the context of the related technology, and unless explicitly defined here, the terms should not be interpreted as too ideal or too formal sense.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
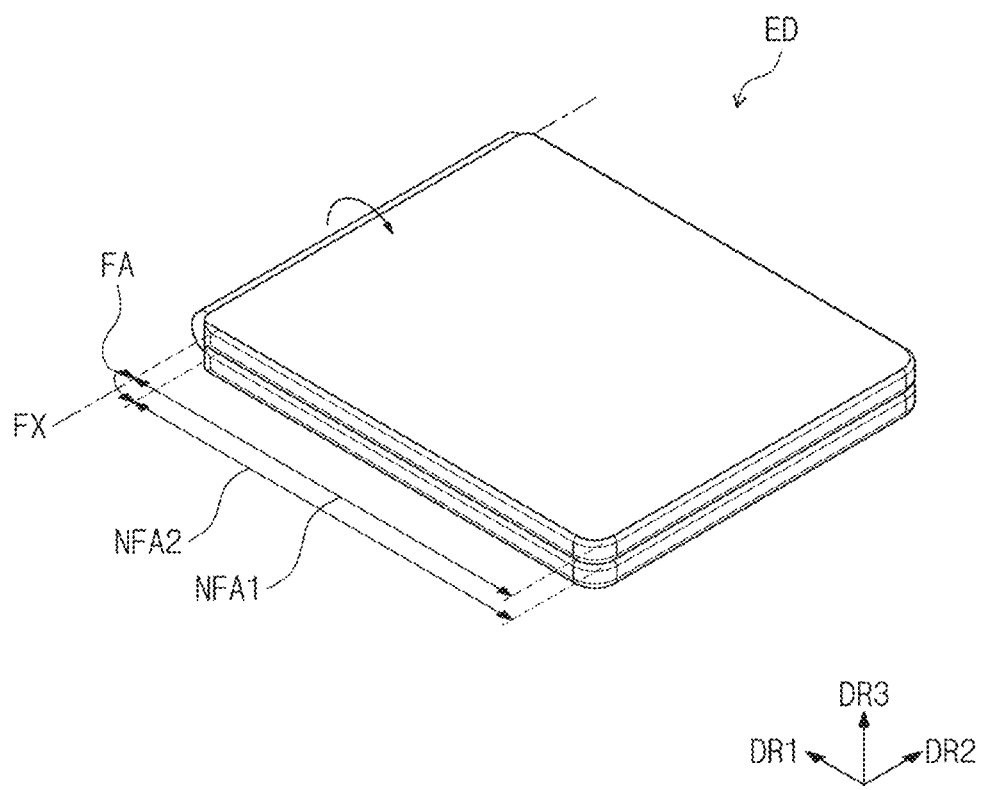
FIG. 2 is a view illustrating the electronic device of FIG. 1 in a folded state.

FIG. 1 is a perspective view illustrating coupling of an electronic device ED according to an embodiment of the invention. FIG. 2 is a view illustrating the electronic device ED of FIG. 1 in a folded state.

Referring to FIG. 1, an embodiment of an electronic device ED according to the invention may have a rectangular shape having long sides extending in a first direction DR1 and short sides extending in a second direction DR2 crossing the first direction DR1. However, the embodiment of the invention is not limited thereto, and the electronic device ED may have various shapes such as a circular shape, a polygonal shape, and the like. The electronic device ED may be a flexible electronic device.

Hereinafter, a direction that substantially perpendicularly crosses a plane defined by the first direction DR1 and the second direction DR2 is defined as a third direction DR3. The third direction DR3 may be a thickness direction of the electronic device ED. In this specification, "on a plane" may be understood as "in the third direction DR3". In this specification, the meaning of "overlapping" may mean a state in which components are arranged to overlap each other when viewed on a plane or in the third direction DR3. In this specification, "thickness" may be understood as "thickness measured in the third direction DR3".

The electronic device ED may include a folding area FA and a plurality of non-folding areas NFA1 and NFA2. In one embodiment, for example, the non-folding areas NFA1 and NFA2 may include a first non-folding area NFA1 and a second non-folding area NFA2. In one embodiment, for example, the folding area FA may be disposed between the first non-folding area NFA1 and the second non-folding area NFA2. In such an embodiment, the first non-folding area NFA1, the folding area FA, and the second non-folding area NFA2 may be sequentially arranged in the first direction DR1.

In an embodiment, as shown in FIG. 1, the electronic device ED may include one folding area FA and two non-folding areas NFA1 and NFA2, for example, but the number of folding areas FA and non-folding areas NFA1 and NFA2 is not limited thereto. In one alternative embodiment, for example, the electronic device ED may include three or more non-folding areas and two or more folding areas disposed between the non-folding areas.

A top surface of the electronic device ED may be defined as a display surface DS, and the display surface DS may be on a plane defined by the first direction DR1 and the second direction DR2. An image IM generated by the electronic device ED may be provided to a user through the display surface DS.

The display surface DS may include a first signal area TA1, a second signal area TA2, a display area DA, and an non-display area NDA around the display area DA. The display area DA may display an image, and the non-display area NDA may not display an image. The non-display area NDA may surround the display area DA and define an edge of the electronic device ED printed with a predetermined color. The non-display area NDA may be disposed at one side of the display area DA or may be omitted.

The first signal area TA1 and the second signal area TA2 may be areas through which an optical signal passes. In one embodiment, for example, natural light, visible light, or infrared light may pass through the first signal area TA1 and the second signal area TA2.

In an embodiment, each of the first signal area TA1 and the second signal area TA2 may display an image. Each of the first signal area TA1 and the second signal area TA2 may have transmittance higher than that of each of the display area DA and the non-display area NDA so that the optical signal passes while displaying the image. In an embodiment, the first signal area TA1 and the second signal area TA2 may be adjacent to the display area DA.

The electronic device ED may photograph or capture an external image through the optical signal passing through the first signal area TA1 and the second signal area TA2 or may determine accessibility of an external object through infrared rays. In an embodiment, one first signal area TA1 and two second signal areas TA2 may be defined as illustrated in FIG. 1, but the embodiment of the invention is not limited thereto. In one alternative embodiment, for example, the first signal area TA1 may be omitted, or two or more first signal areas TA1 may be disposed. In one alternative embodiment, for example, the second signal area TA2 may be omitted, one second signal area TA2 may be provided, or three or more second signal areas TA2 may be provided.

Referring to FIG. 2, the electronic device ED may be a foldable electronic device ED that is foldable or unfoldable. In one embodiment, for example, the folding area FA may be bent with respect to a folding axis FX parallel to the second direction DR2, and thus, the electronic device ED may be folded. In one embodiment, for example, the folding axis FX may be parallel to the short side of the electronic device ED. However, the embodiment of the invention is not limited thereto, and alternatively, the folding axis FX may be parallel to the long side of the electronic device ED.

In an embodiment, as illustrated in FIG. 2, the folding area FA may be folded with respect to the folding axis FX, and the first non-folding area NFA1 and the second non-folding areas NFA2 may face each other in a folded state. That is, the electronic device ED may be inner-folded so that the display surface DS (see FIG. 1) is not exposed to the outside.

Alternatively, the electronic device ED may be outer-folded so that the display surface DS (see FIG. 1) is exposed to the outside. According to an embodiment of the invention, the electronic device ED may be configured to repeatedly perform an inner-folding operation or an outer-folding operation from an unfolding operation, but is not limited thereto. In an embodiment of the invention, the electronic device ED may be configured to selectively perform one of the unfolding operation, the inner-folding operation, and the outer-folding operation.

Figure 3:
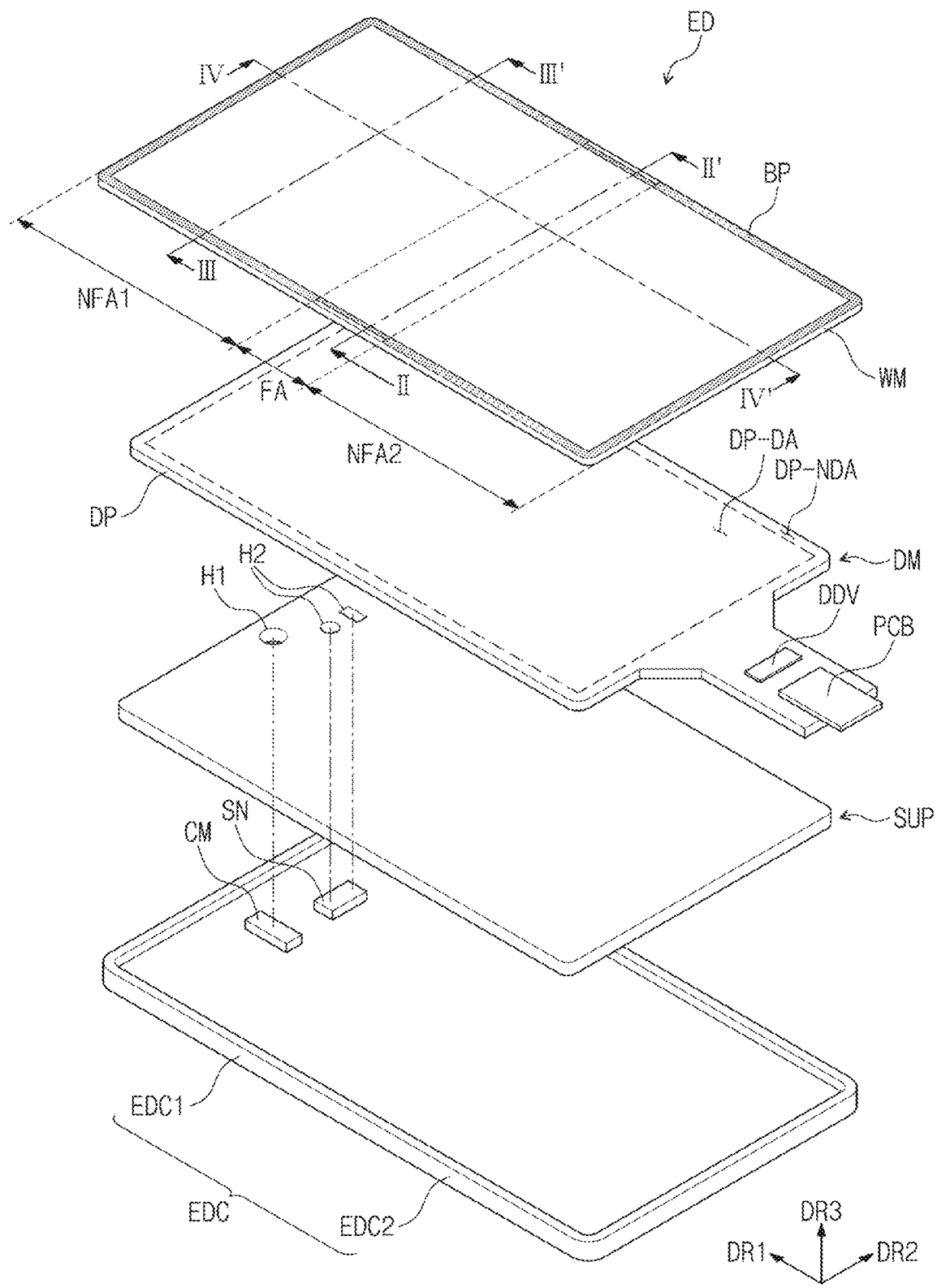
FIG. 3 is an exploded perspective view of the electronic device according to an embodiment of the invention.

FIG. 3 is an exploded perspective view of the electronic device ED according to an embodiment of the invention.

Referring to FIG. 3, an embodiment of the electronic device ED may include a window module WM, a display module DM, a support part SUP, a case EDC, and electronic modules CM and SN. Although not shown, the electronic device ED may further include a power module.

The window module WM provides a front surface of the electronic device ED. The window module WM may include a bezel pattern BP to improve aesthetics of the electronic device ED. In an embodiment, the window module WM may include the bezel pattern BP to prevent internal constituents of the electronic device ED from being visually recognized from the outside. This will be described later in detail.

The display module DM may include a display panel DP. The display panel DP includes an active area DP-DA and a non-active area DP-NDA, which correspond to the display area DA (see FIG. 1) and the non-display area NDA (see FIG. 1) of the electronic device ED, respectively. In this specification, "area/portion corresponds to area/portion" may mean that overlap each other and are not limited to having a same area. The non-active area DP-NDA may be an area on which the image is not displayed, and an element for driving the electronic device ED is disposed. The bezel pattern BP of the window module WM may be disposed to overlap the non-active area DP-NDA, thereby improving the aesthetics of the electronic device ED. The bezel pattern BP is also disposed to overlap the non-display area NDA (see FIG. 1).

The display module DM may include a data driver DDV disposed in the non-active area DP-NDA. The display module DM may further include a circuit film PCB coupled to the non-active area DP-NDA. The circuit film PCB may be a flexible circuit film.

The data driver DDV may include driving elements for driving pixels of the display panel DP, for example, a data driving circuit. FIG. 3 illustrates an embodiment having a structure in which the data driver DDV is mounted on the display panel DP, but the embodiment of the invention is not limited thereto. In one alternative embodiment, for example, the data driver DDV may be mounted on the circuit film PCB.

The support part SUP may be disposed under the display module DM to support the display module DM. The configuration of the support part SUP will be described later in greater detail.

The case EDC accommodates the window module WM, the display module DM, and the support part SUP. The case EDC may protect the window module WM, the display module DM, and the support part SUP. In an embodiment, the case EDC may be defined by two cases EDC1 and EDC2 separated from each other, but is not limited thereto. In one embodiment, for example, the electronic device ED may further include a hinge structure for connecting the two cases EDC1 and EDC2 to each other.

The electronic modules CM and SN may be electronic components that output or receive optical signals.

The electronic modules CM and SN transmit or receive the optical signals through the first signal area TA1 and the second signal area TA2. In one embodiment, for example, the electronic modules CM and SN may include a sensor SN and a camera CM.

The camera CM may receive natural light through the first signal area TA1 to photograph an external image.

The sensor SN may be a proximity sensor that receives the natural light through the second signal area TA2. However, the types of sensor SN are not limited thereto.

The sensor SN and the camera CM may be disposed on the first non-folding area NFA1, but the positions of the sensor SN and the camera CM are not limited thereto.

The sensor SN and the camera CM may be disposed under the display module DM.

Figure 4A:
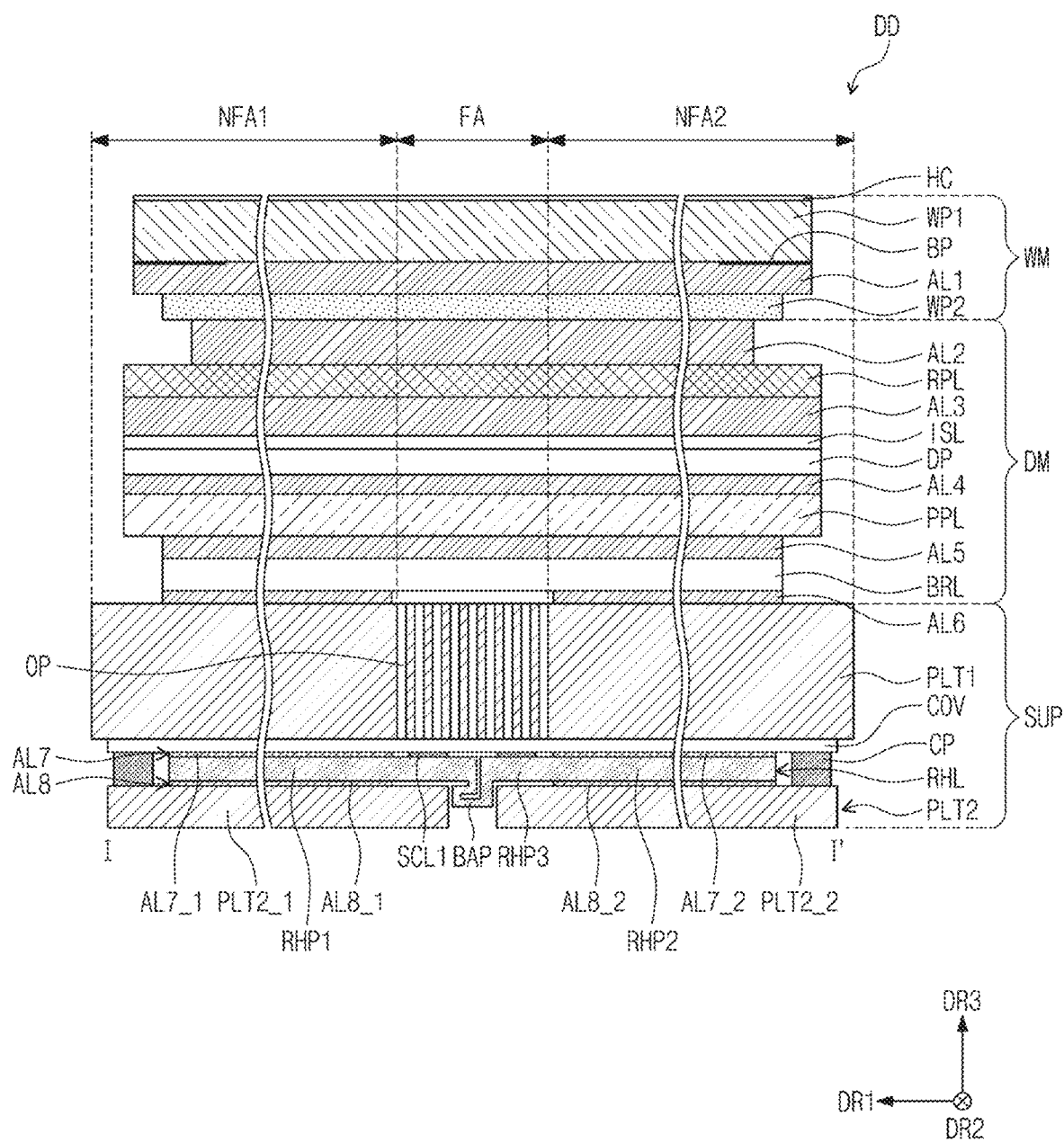
FIG. 4A is a cross-sectional view taken along line I-I' of FIG. 1.
Figure 4B:
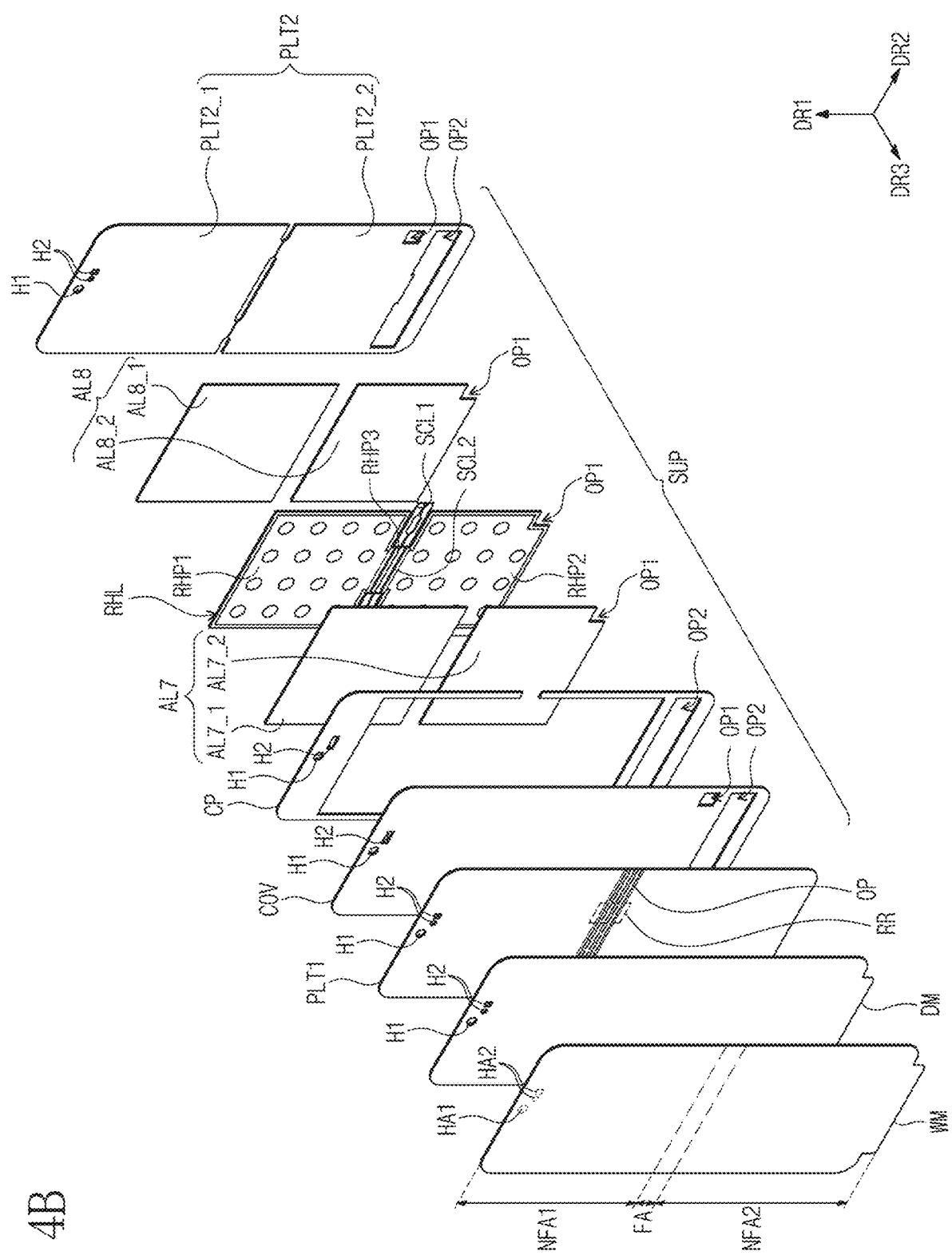
FIG. 4B is an exploded perspective view of a support part according to an embodiment of the invention.
Figure 4C:
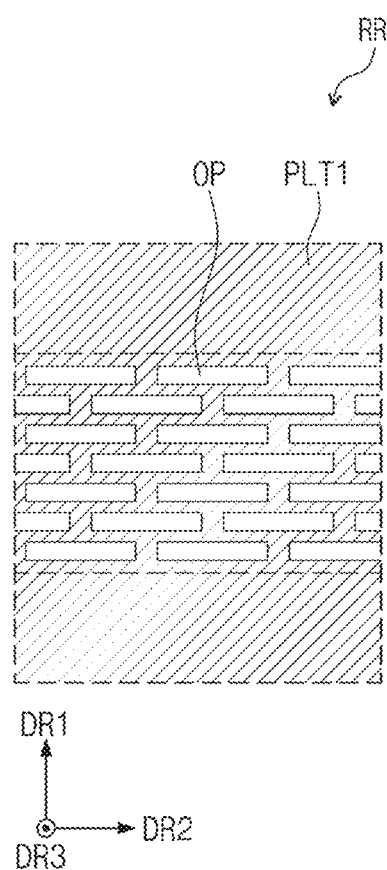
FIG. 4C is an enlarged plan view of an area RR of FIG. 4B according to an embodiment of the invention.

FIG. 4A is a cross-sectional view taken along line I-I' of FIG. 1. FIG. 4B is an exploded perspective view of the support part SUP according to an embodiment of the invention. FIG. 4C is an enlarged plan view of an area RR of FIG. 4B according to an embodiment of the invention.

FIG. 4A is an enlarged cross-sectional view taken along line I-I' of an embodiment where the electronic device ED is a display device DD. In an embodiment, as shown in FIG. 4A, the display device DD may include a window module WM, a display module DM, and a support part SUP disposed under the display module DM.

The folding area FA, the first non-folding area NFA1, and the second non-folding area NFA2 may be defined in the display device DD according to an embodiment of the invention.

The window module WM may be disposed on the display module DM to protect the display module DM from the outside. The window module WM may have a multi-layered structure. In one embodiment, for example, the window module WM may include a plurality of synthetic resin films, which are bonded to each other with an adhesive therebetween, or include a glass substrate and a synthetic resin film, which are bonded to each other with an adhesive.

An embodiment of the window module WM according to the invention may include a hard coating layer HC, a first window WP1, a bezel pattern BP disposed under the first window WP1, a first adhesive layer AL1, and a second window WP2.

The first window WP1 may be a window protection layer. The first window WP1 may have a thickness in a range of about 50 micrometers (μm) to about 80 μm. The first window WP1 may include at least one of polyimide, polycarbonate, polyamide, triacetylcellulose, polymethylmethacrylate, polyethylene, polyurethane, or polyethylene terephthalate. In one embodiment, for example, the window module WM may have the structure in which the hard coating layer HC is disposed on a top surface of the first window WP1, but the embodiment of the invention is not limited thereto, and alternatively at least one of an anti-fingerprint layer and a scattering anti-reflection layer may be further disposed on the top surface of the first window WP1.

The first window WP1 may be attached to a top surface of the second window WP2 by the first adhesive layer AL1. However, the embodiment of the invention is not limited thereto, and the first window WP1 may include a plastic resin layer disposed directly on the top surface of the second window WP2. Alternatively, the first window WP1 may further include at least one of an inorganic layer disposed directly on the top surface of the second window WP2, at least one organic layer, an organic/inorganic composite layer, and a functional coating layer.

The first adhesive layer AL1 may include a transparent adhesive such as a pressure sensitive adhesive ("PSA") or an optically clear adhesive ("OCA"), but the type of adhesives is not limited thereto. The description of the first adhesive layer AL1 may be equally applied to second to eighth adhesive layers AL2 to AL8, which will be described below.

The second window WP2 may be a window base layer. In one embodiment, for example, the second window WP2 may be a thin film glass substrate or a plastic film. In an embodiment, the second window WP2 may be a chemically tempered glass substrate. The second window WP2 may have a thickness in a range of about 15 μm to about 100 μm. In one embodiment, for example, the second window WP2 may have a thickness in a range of about 20 μm to about 50 μm. The second window WP2 may minimize an occurrence of wrinkles even when the folding and the unfolding are repeated.

The bezel pattern BP may be disposed on one surface of the first window WP1 or one surface of the second window WP2. FIG. 4A illustrates one embodiment where the bezel pattern BP is disposed on a bottom surface of the first window WP1. However, the embodiment of the invention is not limited thereto, and alternatively, the bezel pattern BP may be disposed on the top surface of the first window WP1 or the top surface of the second window WP2. The bezel pattern BP may be formed as or defined by a colored light blocking layer, for example, in a coating manner. The bezel pattern BP may include a base material and a dye or pigment mixed with the base material.

FIG. 4A is a cross-sectional view taken along line I-I'. In FIG. 4A, the bezel pattern BP is illustrated to overlap the first non-folding area NFA1 and the second non-folding area NFA2, but the bezel pattern BP may also overlap the folding area FA at another portion of the display device DD. In addition, the position, shape, and length of the bezel pattern BP are not limited to the illustrated configuration. This will be described below in detail.

The display module DM may be a flexible display module. The display module DM may include a first non-folding area NFA1, a folding area FA, and a second non-folding area NFA2, which are arranged in the first direction DR1.

The display module DM may include a display panel DP, an anti-reflection layer RPL, a panel protection layer PPL, a barrier layer BRL, and second to sixth adhesive layers AL2 to AL6. The anti-reflection layer RPL may be disposed on the display panel DP. The panel protection layer PPL may be disposed below the display panel DP.

The anti-reflection layer RPL may be defined by an external light anti-reflection film. The anti-reflection layer RPL may reduce reflectance of external light incident toward the display panel DP from the outside. In an embodiment, the anti-reflection layer RPL may prevent external light from being reflected and recognized by the user after being incident toward the display panel DP.

In one embodiment, for example, the anti-reflection layer RPL may include a plurality of color filters for displaying a same color as the pixels. The color filters may filter external light to display a same color as that of the pixels. In such an embodiment, the external light may not be visually recognized by the user. However, the embodiment of the invention is not limited thereto, and alternatively, the anti-reflection layer RPL may include a phase retarder and/or a polarizer.

The second adhesive layer AL2 may be disposed between the window module WM and the anti-reflection layer RPL. The window module WM and the display module DM may be bonded to each other by the second adhesive layer AL2.

The third adhesive layer AL3 may be disposed under the anti-reflection layer RPL. An input sensing layer ISL and an anti-reflection layer RPL may be bonded to each other by the third adhesive layer AL3.

A display panel DP may be disposed under the input sensing layer ISL. In one embodiment, for example, the display module DM may have the structure in which the input sensing layer ISL is disposed directly on the display panel DP, but the embodiment of the invention is not limited thereto, and alternatively, a separate adhesive layer may be disposed between the input sensing layer ISL and the display panel DP.

The fourth adhesive layer AL4 may be disposed under the display panel DP. The fourth adhesive layer AL4 may bond the display panel DP and the panel protection layer PPL to each other.

The panel protection layer PPL may be disposed below the display panel DP. The panel protection layer PPL may protect a lower portion of the display panel DP. The panel protection layer PPL may include a flexible plastic material. In one embodiment, for example, the panel protection layer PPL may include polyethylene terephthalate.

The fifth adhesive layer AL5 may be disposed under the panel protection layer PPL. The fifth adhesive layer AL5 may bond the panel protection layer PPL and the barrier layer BRL to each other.

The barrier layer BRL may be disposed below the panel protection layer PPL. The barrier layer BRL may improve resistance to compressive force due to external pressing. The barrier layer BRL may prevent the display panel DP from being deformed. The barrier layer BRL may include a flexible plastic material such as polyimide or polyethylene terephthalate.

In an embodiment, the barrier layer BRL may have a color that absorbs light. The barrier layer BRL may have a black color. In such an embodiment, when viewing the display module DM from an upper side of the display module DM, components disposed below the barrier layer BRL may not be visually recognized.

The sixth adhesive layer AL6 may be disposed between the barrier layer BRL, and the first plate PLT1. The barrier layer BRL and the first plate PLT1 may be attached to each other by the sixth adhesive layer AL6.

Referring to FIGS. 4A, 4B, and 4C together, the support part SUP may be disposed under the display module DM.

The support part SUP may include a first plate PLT1, a second plate PLT2, a cover layer COV, a step compensation layer CP, a heat dissipation layer RHL, a seventh adhesive layer AL7, an eighth adhesive layer ALB, a plurality of first sub-step compensation layers SCL1, and a plurality of second sub-step compensation layers SCL2.

The first plate PLT1 may be disposed under the display module DM to support the display module DM. The first plate PLT1 may include a material having an elastic modulus of about 60 gigapascal (GPa) or greater. The first plate PLT1 may include a metal material such as stainless steel. In one embodiment, for example, the first plate PLT1 may include SUS 304, but is not limited thereto. In one embodiment, for example, the first plate PLT1 may include at least one selected from other various metal materials.

A plurality of openings OP may be defined in a portion of the first plate PLT1 overlapping the folding area FA. The openings OP may be defined through portions of the first plate PLT1 in the third direction DR3.

In such an embodiment where the openings OP are defined in the portion of the first plate PLT1 overlapping the folding area FA, flexibility of the portion of the first plate PLT1, which overlaps the folding area FA, may increase. As a result, the first plate PLT1 may be easily folded with respect to the folding area FA.

Referring to an area RR illustrated in FIG. 4C, the openings OP defined in the first plate PLT1 may be arranged in a predetermined rule or form. In one embodiment, for example, the openings OP may be arranged in a grid shape. Based on a column corresponding to the second direction DR2, the openings OP arranged in an h-th column and the openings OP arranged in an (h+1)-th column may be alternately arranged.

In an embodiment, as described above, since the openings OP are defined in the portion of the first plate PLT1, which overlaps the folding area FA, the first plate PLT1 may be easily folded on the area overlapping the folding area FA.

Referring back to FIGS. 4A and 4B, the cover layer COV may be disposed under the first plate PLT1. The cover layer COV may cover the openings OP defined in the first plate PLT1 under the first plate PLT1.

The cover layer COV may have an elastic modulus lower than that of the first plate PLT1. In one embodiment, for example, the cover layer COV may include thermoplastic polyurethane or rubber, but the material of the cover layer COV is not limited thereto. The cover layer COV may be manufactured in the form of a sheet and attached to the first plate PLT1.

The second plate PLT2 may be disposed under the first plate PLT1. The cover layer COV may be disposed between the first plate PLT1 and the second plate PLT2. The second plate PLT2 may include a metal.

When viewed on the plane, the second plate PLT2 may include a first second plate PLT2_1 overlapping the first non-folding area NFA1 and a second second plate PLT2_2 overlapping the second non-folding area NFA2. The first second plate PLT2_1 and the second second plate PLT2_2 may be spaced apart from each other under the folding area FA. The first second plate PLT2_1 may support the first non-folding area NFA1. The second second plate PLT2_2 may support the second non-folding area NFA2. In an embodiment, the first second plate PLT2_1 and the second second plate PLT2_2 may support the first plate PLT1. In one embodiment, for example, when a pressure is applied to the first plate PLT1 from an upper side, the portion of the first plate PLT1, in which the openings OP are defined, may be prevented from being deformed by the first second plate PLT2_1 and the second second plate PLT2_2.

The heat dissipation layer RHL may perform a heat dissipation function. In one embodiment, for example, the heat dissipation layer RHL may include graphite, but the material of the heat dissipation layer RHL is not limited thereto. Since the heat dissipation layer RHL performs the heat dissipation function together with the first and second plates PLT1 and PLT2, the heat dissipation performance of the display device DD may be improved.

The heat dissipation layer RHL may be disposed between the first plate PLT1 and the second plate PLT2. In an embodiment, the heat dissipation layer RHL may be disposed between the cover layer COV and the second plate PLT2. A portion of the heat dissipation layer RHL, which overlaps the folding area FA, may be bent to be disposed between the first second plate PLT2_1 and the second second plate PLT2_2.

The heat dissipation layer RHL may include a first heat dissipation part RHP1, a second heat dissipation part RHP2, and a third heat dissipation part RHP3 disposed between the first heat dissipation part RHP1 and the second heat dissipation part RHP2. The first heat dissipation part RHP1 may overlap the first non-folding area NFA1, the second heat dissipation part RHP2 may overlap the second non-folding area NFA2, and the third heat dissipation part RHP3 may overlap the folding area FA.

A portion of the third heat dissipation part RHP3 may be bent to be disposed between the first second plate PLT2_1 and the second second plate PLT2_2. A portion of the bent third heat dissipation part RHP3 may be defined as a bending part BAP.

The bending part BAP may protrude lower than the first and second heat dissipation parts RHP1 and RHP2 and may be disposed between the first second plate PLT2_1 and the second second plate PLT2_2. In one embodiment, for example, the bending part BAP may be bent twice in a downward direction and a left direction, but the bent shape of the bending part BAP is not limited thereto. In a state in which the display module DM and the support part SUP are unfolded, the bending part BAP may be maintained in the bent state.

The first heat dissipation part RHP1, the second heat dissipation part RHP2, and the third heat dissipation part RHP3 may be integrally formed with each other as a single unitary unit. The heat dissipation layer RHL may include the third heat dissipation part RHP3 disposed under the folding area FA to improve the heat dissipation performance of the display device DD. In an embodiment, since a surface area of the third heat dissipation part RHP3 including the bending part BAP may be maximized, and the heat dissipation performance is proportional to the surface area of the heat dissipation layer RHL, the heat dissipation performance of the display device DD may be improved.

However, the embodiment of the invention is not limited thereto, and alternatively, the display device DD may include a separable heat dissipation layer. In an embodiment, the heat dissipation layer may include a first heat dissipation part RHP1 and a second heat dissipation part RHP2, which are spaced apart from each other, without including the third heat dissipation part RHP3.

Hereinafter, the heat dissipation layer RHL including the first heat dissipation part RHP1, the second heat dissipation part RHP2, and the third heat dissipation part RHP3 will be described as a reference.

The seventh adhesive layer AL7 may be disposed between the first plate PLT1 and the heat dissipation layer RHL. In an embodiment, the seventh adhesive layer AL7 may be disposed between the cover layer COV and the heat dissipation layer RHL, and the cover layer COV may be disposed between the first plate PLT1 and the seventh adhesive layer AL7.

In an embodiment, the seventh adhesive layer AL7 may include a first seventh adhesive layer AL7_1 and a second seventh adhesive layer AL7_2, which are spaced apart from each other. The first seventh adhesive layer AL7_1 and the second seventh adhesive layer AL7_2 may be spaced apart from each other in the first direction DR1. The first seventh adhesive layer AL7_1 may overlap the first non-folding area NFA1, and the second seventh adhesive layer AL7_2 may overlap the second non-folding area NFA2. In such an embodiment, the seventh adhesive layer AL7 may not overlap the folding area FA. Thus, the folding operation of the support part SUP may be more easily performed.

The eighth adhesive layer AL8 may be disposed between the second plate PLT2 and the heat dissipation layer RHL.

In an embodiment, the eighth adhesive layer AL8 may include a first eighth adhesive layer AL8_1 and a second eighth adhesive layer AL8_2, which are spaced apart from each other. The first eighth adhesive layer AL8_1 and the second eighth adhesive layer AL8_2 may be spaced apart from each other in the first direction DR1. The first eighth adhesive layer AL8_1 may overlap the first non-folding area NFA1, and the second eighth adhesive layer AL8_2 may overlap the second non-folding area NFA2. In such an embodiment, the eighth adhesive layer AL8 may not overlap the folding area FA. Thus, the folding operation of the support part SUP may be more easily performed.

The step compensation layer CP may be disposed between the cover layer COV and the second plate PLT2. The step compensation layer CP may be disposed around an edge of the heat dissipation layer RHL and around an edge of each of the seventh and eighth adhesive layers AL7 and AL8. In one embodiment, for example, the step compensation layer CP may be a double-sided tape.

The heat dissipation layer RHL, the seventh adhesive layer AL7, and the eighth adhesive layer AL8 may be disposed inwardly from an edge of the cover layer COV and an edge of the second plate PLT2.

The step compensation layer CP may be disposed between the cover layer COV and the second plate PLT2 to compensate a height difference of a portion on which the heat dissipation layer RHL, the seventh adhesive layer AL7, and the eighth adhesive layer AL8 are not disposed.

The display device DD may further include first and second sub-step compensation layers SCL1 and SCL2.

The first sub-step compensation layers SCL1 may be disposed between the first seventh adhesive layer AL7_1 and the second seventh adhesive layer AL7_2. The first sub-step compensation layers SCL1 may be disposed between the cover layer COV and the heat dissipation layer RHL. The first sub-step compensating layers SCL1 may compensate a height difference of a portion on which the seventh adhesive layer AL7 is not disposed.

The second sub-step compensation layers SCL2 may overlap the folding area FA and may be disposed between the first heat dissipation part RHP1 and the second heat dissipation part RHP2. The second sub-step compensation layers SCL2 may be disposed around the third heat dissipation part RHP3. The third heat dissipation part RHP3 may be disposed between the second sub-step compensation layers SCL2. In FIG. 4A, the first sub-step compensation layers SCL1 are illustrated according to a position of a cutting lines, and the second sub-step compensation layers SCL2 are not illustrated. However, when another portion of the display device DD is cut, the first sub-step compensation layers SCL1 may not be illustrated, and the second sub-step compensation layers SCL2 may be illustrated.

The number of first sub-step compensation layers SCL1 and the number of second sub-step compensation layers SCL2 are not limited thereto. In one embodiment, for example, one or a plurality of sub-step compensation layers may be selectively provided.

Referring to FIG. 4B, a first hole area HA1 and a second hole area HA2 may be defined in the window module WM. A first hole H1 and a second hole H2, which correspond to the first hole area HA' and the second hole area HA2, respectively, may be defined in the display module DM and the support part SUP.

In one embodiment, for example, the first hole H1 may be defined further in the second plate PLT2, the step compensation layer CP, the cover layer COV, the first plate PLT1, the barrier layer BRL, the panel protection layer PPL, the display panel DP, the input sensing layer ISL, the anti-reflection layer RPL, and the second to sixth adhesive layers AL2 to AL6.

In one embodiment, for example, the second hole H2 may be defined further in the second plate PLT2, the step compensation layer CP, the cover layer COV, the first plate PLT1, the barrier layer BRL, the fifth adhesive layer AL5, and the sixth adhesive layer AL6. The above-described camera CM may be disposed in the first hole H1. The above-described sensor SN may be disposed in the second hole H2.

In each of the cover layer COV and the step compensation layer CP, the second holes H2 may be integrally defined. The heat dissipation layer RHL, the seventh and eighth adhesive layers AL7 and AL8, and the first and second sub-step compensation layers SCL1 and SCL2 may not overlap the first and second holes H1 and H2.

A first opening OP1 and a second opening OP2 may be defined in the cover layer COV and the second plate PLT2. The first opening OP1 may also be defined in each of the heat dissipation layer RHL and the seventh and eighth adhesive layers AL7 and AL8. The second opening OP2 may also be defined in the step compensation layer CP.

A cell ID, which is a unique number of a product during a manufacturing process, may be identified through the first opening OP1. Although not shown, a tape may be disposed in the second opening OP2, and the circuit film PCB of FIG. 3 may be bent to be attached to the first plate PLT1 by the tape.

An embodiment of the display device DD according to the invention is described with reference to FIGS. 4A, 4B and 4C, but the embodiment of the invention is not limited thereto.

Figure 5:
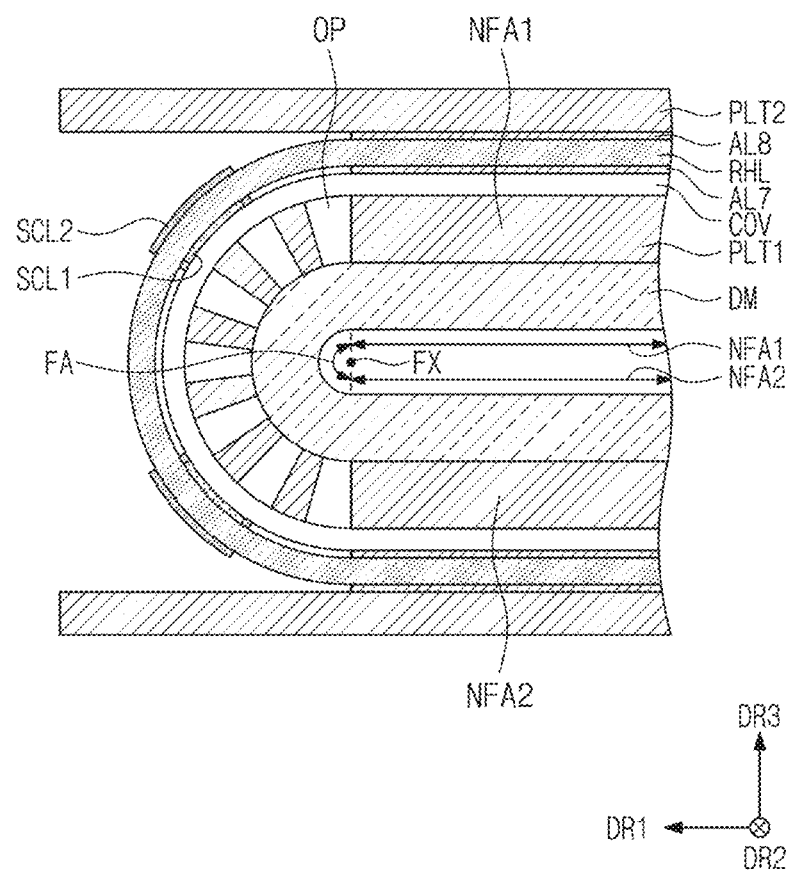
FIG. 5 is a cross-sectional view illustrating a display device of FIG. 4A in a folded state.

FIG. 5 is a cross-sectional view illustrating the display device DD of FIG. 4A in a folded state.

Referring to FIGS. 4A and 5, an embodiment of the display device DD may be changed from the non-folded state illustrated in FIG. 4A to the folded state illustrated in FIG. 5. In FIGS. 4A and 5, one embodiment having a structure in which the display device DD is inner-folded with respect to the folding axis FX parallel to the short side is illustrated. However, the embodiment of the invention is not limited thereto, and the folding axis FX may be parallel to the long side of the display device DD.

Alternatively, the display device DD may be outer-folded with respect to the folding axis FX so that the display surface DS (see FIG. 1) is exposed to the outside.

The display device DD may be changed again from the folded state illustrated in FIG. 5 to the non-folded state illustrated in FIG. 4A. The display device DD may repeatedly perform the above-described folding operation.

Since the display module DM is the flexible display module, the folding area FA of the display module DM may be easily bent. A plurality of openings OP overlapping the folding area FA may be defined in the first plate PLT1. Thus, during the folding operation, a portion of the first plate PLT1, which overlaps the folding area FA, may be easily bent by the openings OP.

The heat dissipation layer RHL may have a curved shape having a predetermined curvature while the bending part BAP illustrated in FIG. 4A is unfolded when the display device DD is folded. Thus, while the folding area FA is folded, the heat dissipation layer RHL may be prevented from being damaged due to tensile force.

Figure 6:
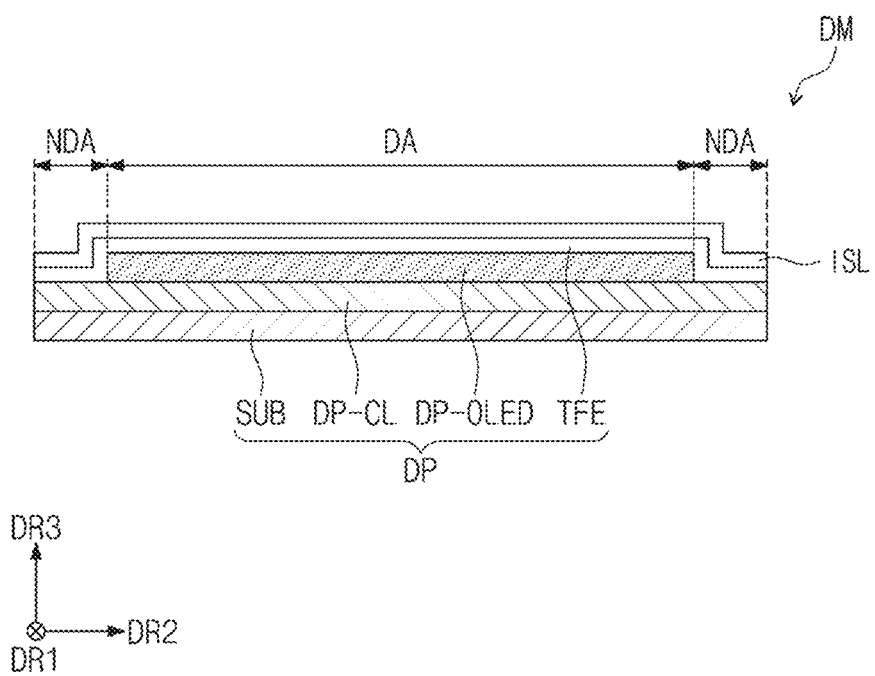
FIG. 6 is a cross-sectional view of a display module according to an embodiment of the invention.

FIG. 6 is a cross-sectional view of the display module DM according to an embodiment of the invention.

Referring to FIG. 6, an embodiment of the display module DM according to the invention may include the display panel DP and the input sensing layer ISL. In an embodiment, the input sensing layer ISL may be provided in the form of a layer. In such an embodiment, the input sensing layer ISL may be disposed directly on the display panel DP. In this specification, that "a constituent A is disposed directly on a constituent B" may mean that an adhesive member is not disposed between the constituents A and B.

The display panel DP includes a base layer SUB, a circuit element layer DP-CL disposed on the base layer SUB, a display element layer DP-OLED, and an encapsulation layer TFE. The base layer SUB may include at least one plastic film. The base layer SUB may include a plastic substrate, a glass substrate, a metal substrate, and an organic/inorganic composite substrate. In such an embodiment, the base layer SUB may be a thin film glass substrate having a thickness of several tens to several hundreds of micrometers. The base layer SUB may have a multi-layered structure. In one embodiment, for example, the base layer SUB may have a structure of polyimide/at least one inorganic layer/polyimide.

The circuit element layer DP-CL may include at least one insulating layer and a circuit element. The insulating layer may include at least one inorganic layer and at least one organic layer. The circuit element may include signal lines, a driving circuit of the pixel, and the like. The circuit element layer DP-CL will be described below in more detail.

The display element layer DP-OLED may include at least one light emitting element, for example, organic light emitting diodes. The display element layer DP-OLED may further include an organic layer such as a pixel defining layer.

The encapsulation layer TFE may include a plurality of thin films. Some of the thin films may be disposed to improve optical efficiency, and others of the thin films may be disposed to protect the organic light emitting diodes. The encapsulation layer TFE may include at least one organic layer and at least one inorganic layer. In one embodiment, for example, the encapsulation layer TFE may have an inorganic layer/organic layer/inorganic layer structure. The encapsulation layer TFE may cover the display element layer DP-OLED.

However, the embodiment of the invention is not limited thereto, and in another embodiment of the invention, the input sensing layer ISL may be provided as an individual panel and may be coupled to the display panel DP through an adhesive layer. In an embodiment, instead of the encapsulation layer TFE, an encapsulation substrate may be coupled to the display panel DP, and the input sensing layer ISL may be attached to the encapsulation substrate in the form of a panel.

Figure 7:
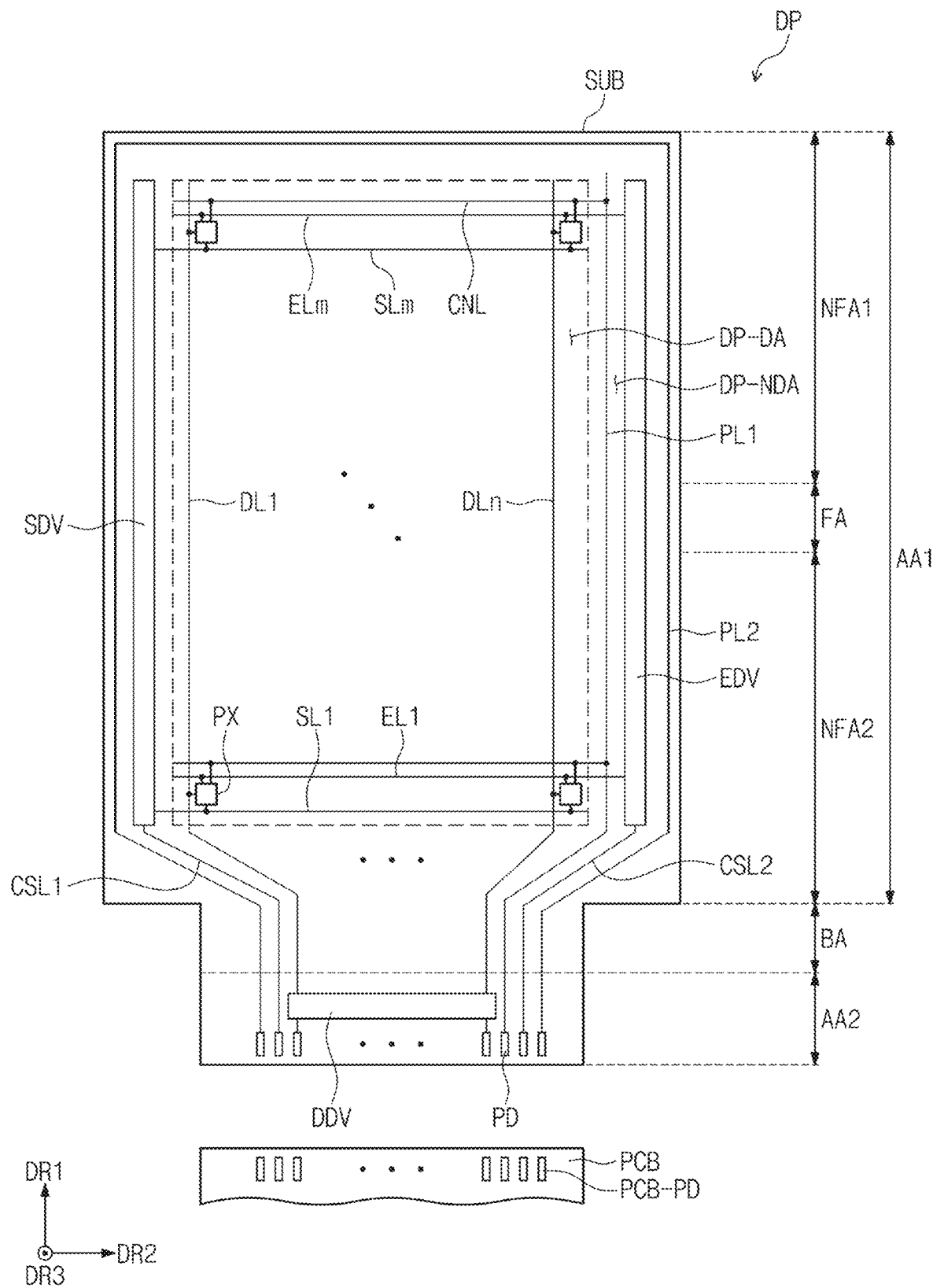
FIG. 7 is a plan view of a display panel according to an embodiment of the invention.

FIG. 7 is a plan view of the display panel DP according to an embodiment of the invention.

An embodiment of the display panel DP according to the invention may be an emission-type display panel, but is not particularly limited thereto. In one embodiment, for example, the display panel DP may be an organic light emitting display panel or an inorganic light emitting display panel. An emission layer of the organic light emitting display panel may include an organic light emitting material. An emission layer of the inorganic light emitting display panel may include a quantum dot, a quantum rod, and the like. Hereinafter, for convenience of description, an embodiment where the display panel DP is the organic light emitting display panel will be described.

Referring to FIG. 7, an embodiment of the display panel DP may include a first area AA1, a second area AA2, and a bending area BA between the first area AA1 and the second area AA2. The bending area BA may extend in the second direction DR2, and the first area AA1, the bending area BA, and the second area AA2 may be arranged in the first direction DR1.

In an embodiment, the first area AA1 may have long sides that extend in the first direction DR1 and face each other in the second direction DR2.

In an embodiment, as described above, an active area DP-DA and a non-active area DP-NDA may be defined in the display panel DP. The first area AA1 may overlap the active area DP-DA and the non-active area DP-NDA. The bending area BA and the second area AA2 may overlap only the non-active area DP-NDA. The bending area BA and the second area AA2 may be areas on which an image is not displayed.

In an embodiment, the first non-folding area NFA1, the second non-folding area NFA2, and the folding area FA may be defined in the first area AA1. The first non-folding area NFA1, the folding area FA, and the second non-folding area NFA2 may be sequentially defined in the first direction DR1.

The display panel DP may include a base layer SUB and a scan driver SDV, a data driver DDV, and an emission driver EDV, which are disposed on the base layer SUB.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, a first power line PL1, a second power line PL2, connection lines CNL, and a plurality of pads PD on the base layer SUB. Here, m and n are positive integer. The pixels PX may be disposed in the display area DA. The pixels PX may be connected to the scan lines SL1 to SLm, the data lines DL1 to DLn, and the emission lines EL1 to ELm.

The scan driver SDV and the emission driver EDV may be disposed in the non-display area NDA. The scan driver SDV and the emission driver EDV may be disposed in the non-active area DP-NDA that is adjacent to each of the long sides of the first area AA1. The data driver DDV may be disposed in the second area AA2. The data driver DDV may be in the form of an integrated circuit chip and mounted in the second area AA2.

The scan lines SL1 to SLm may extend in the second direction DR2 and be connected to the scan driver SDV. The data lines DL1 to DLn may extend in the first direction DR1 and be connected to the data driver DDV via the bending area BA. The emission lines EL1 to ELm may extend in the second direction DR2 and be connected to the emission driver EDV.

The first power line PL1 may extend in the first direction DR1 and be disposed in the non-active area DP-NDA. The second power line PL2 may be disposed in the non-active area DP-NDA adjacent to the long sides of the first area AA1 and the non-display area NDA facing the second area AA2 with the active area DP-DA therebetween. The second power line PL2 may be disposed outside the scan driver SDV and the emission driver EDV. The connection lines CNL may be connected to the first power line PL1 and the pixels PX. The connection lines CNL may provide a first voltage applied to the first power line PL1 to the pixels PX. The first control line CSL1 may be connected to the scan driver SDV and extends toward a lower end of the second area AA2 via the bending area BA. The second control line CSL2 may be connected to the emission driver EDV and extends toward the lower end of the second area AA2 via the bending area BA. The data driver DDV may be disposed between the first control line CSL1 and the second control line CSL2.

When viewed on the plane, the pads PD may be disposed adjacent to the lower end of the second area AA2. The data driver DDV, the first power line PL1, the second power line PL2, the first control line CSL1, and the second control line CSL2 may be connected to the pads PD.

The display device DD may include a circuit film PCB including pad areas PCB-PD connected to the pads PD. The display panel DP may be connected to an external driving element through the circuit film PCB.

Figure 8A:
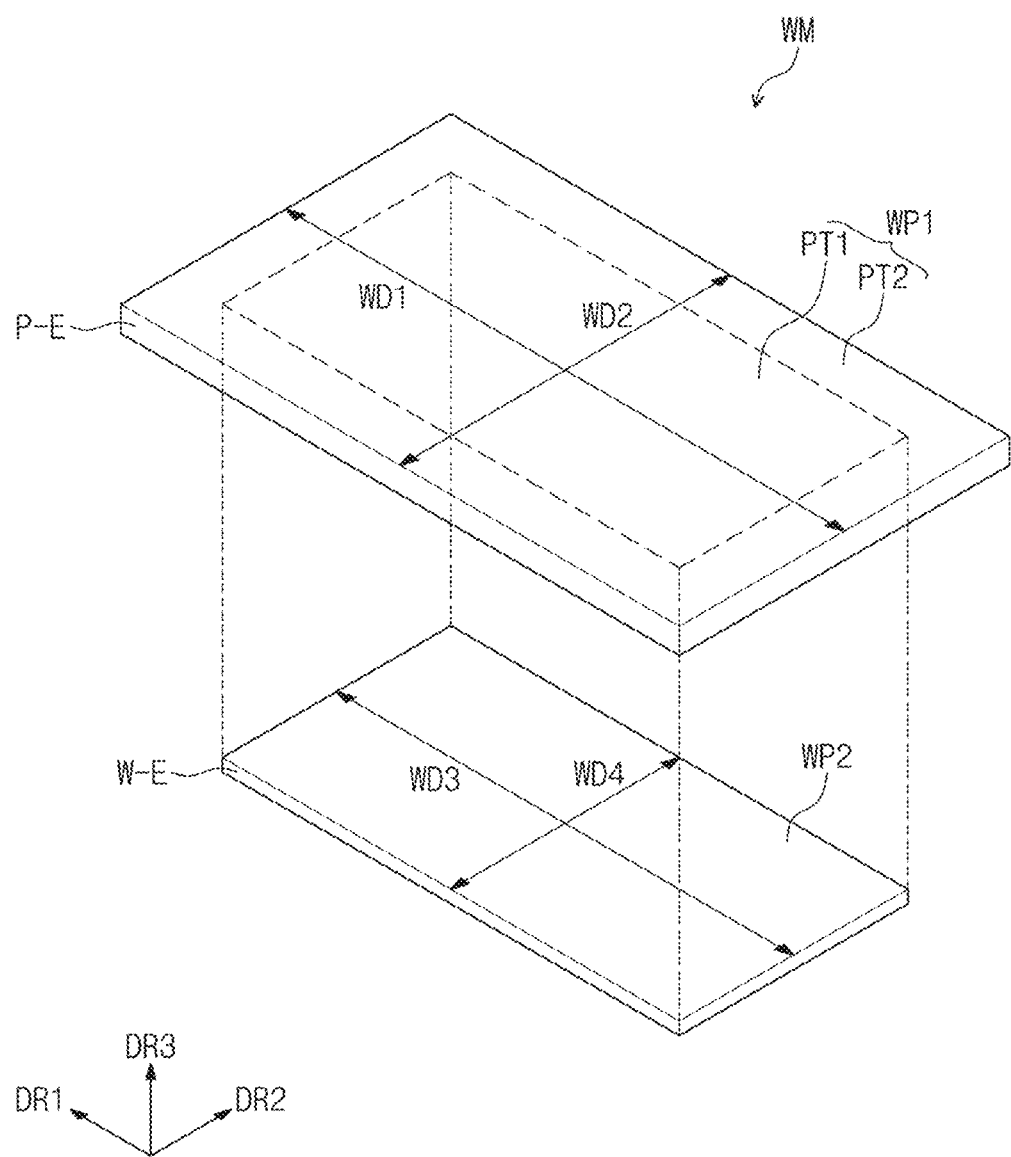
FIG. 8A is an exploded perspective view of a window module according to an embodiment of the invention.

FIG. 8A is an exploded perspective view of the window module according to an embodiment of the invention.

FIG. 8A is an enlarged view of a first window WP1 and a second window WP2 among constituents of the window module WM. As described above, the window module WM may further include the first adhesive layer AL1 (see FIG. 4A) disposed between the first window WP1 and the second window WP2. Alternatively, the first adhesive layer AL1 (see FIG. 4A) may be omitted.

In an embodiment of the invention, the first window WP1 may have a size greater than that of the second window WP2. In an embodiment, a long side length WD1 of the first window WP1 in the first direction DR1 may be greater than a long side length WD3 of the second window WP2 in the first direction DR1. A short side length WD2 of the first window WP1 in the second direction DR2 may be greater than a short side length WD4 of the second window WP2 in the second direction DR2.

An edge W-E of the second window WP2 may be aligned inwardly from an edge P-E of the first window WP1 on the plane. The first window WP1 may completely cover the second window WP2 to prevent the second window WP2 from being damaged in a process of handling the window module WM.

The first window WP1 may include a first portion PT1 overlapping the second window WP2 on the plane and a second portion PT2 extending from the first potion PT1 not to overlap the second window WP2 on the plane. The second portion PT2 may surround the first portion PT1. The first portion PT1 and the second portion PT2 may be integrated with each other.

In such an embodiment, the first window WP1 and the second window WP2 may be substantially the same as those described above. In such an embodiment, the first window WP1 may be a window protection layer, and the second window WP2 may be a window base layer. In one embodiment, for example, the second window WP2 may be a thin-film tempered glass substrate.

Figure 8B:
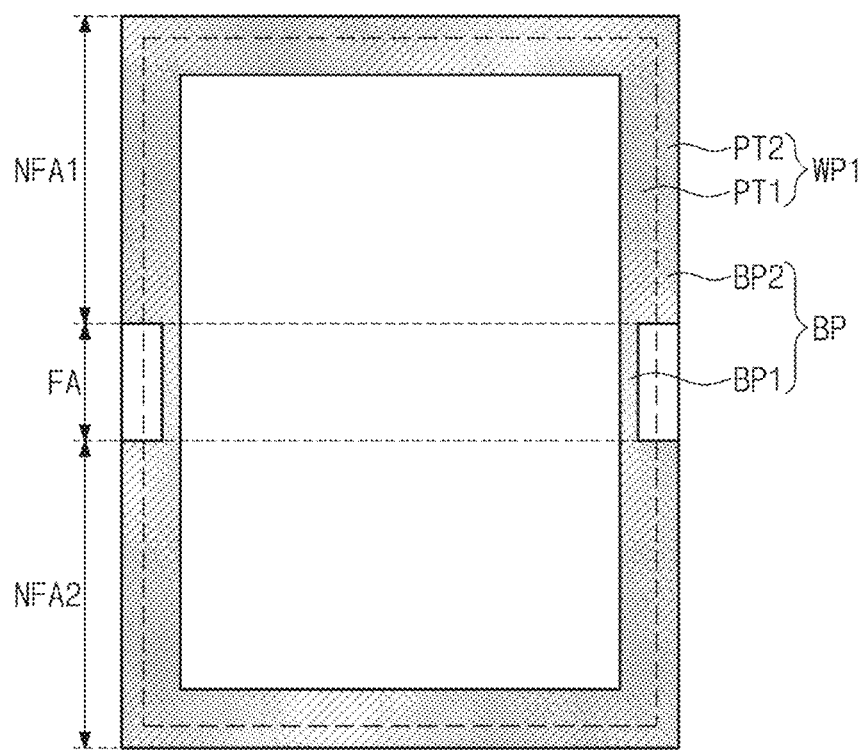
FIG. 8B is a plan view of the window module according to an embodiment of the invention.

FIG. 8B is a plan view of the window module WM according to an embodiment of the invention.

FIG. 8B is an enlarged view of the first window WP1 and the bezel pattern BP among the constituents of the window module WM. The bezel pattern BP may be disposed under the first window WP1. In one embodiment, for example, the bezel pattern BP may be provided or formed by printing a colored light blocking material on a bottom surface of the first window WP1.

Referring to FIG. 8B, the bezel pattern BP may include a first bezel pattern BP1 overlapping the folding area FA and a second bezel pattern BP2 overlapping the non-folding areas NFA1 and NFA2. The first bezel pattern BP1 and the second bezel pattern BP2 may include a same material as each other.

The first bezel pattern BP1 overlaps the first portion PT1 of the first window WP1. In one embodiment, for example, the first bezel pattern BP1 may be disposed adjacent to a boundary between the first portion PT1 and the second portion PT2. The first bezel pattern BP1 may not overlap the second portion PT2.

The second bezel pattern BP2 overlaps both the first portion PT1 and the second portion PT2 of the first window WP1.

The first bezel pattern BP1 may have a width less than that of the second bezel pattern BP2. In an embodiment, the first bezel pattern BP1 and the second bezel pattern BP2 are integrally formed with each other as a single unitary unit. In an embodiment, when viewed from a plan view in a thickness direction of the display device DD, at least a portion of an edge of the second window WP2 does not overlap the bezel pattern.

An embodiment of the display device DD according to the invention may include the bezel pattern BP including the first bezel pattern BP1 and the second bezel pattern BP2 to partially adjust transmittance of the first window WP1 as desired.

Figure 9A:
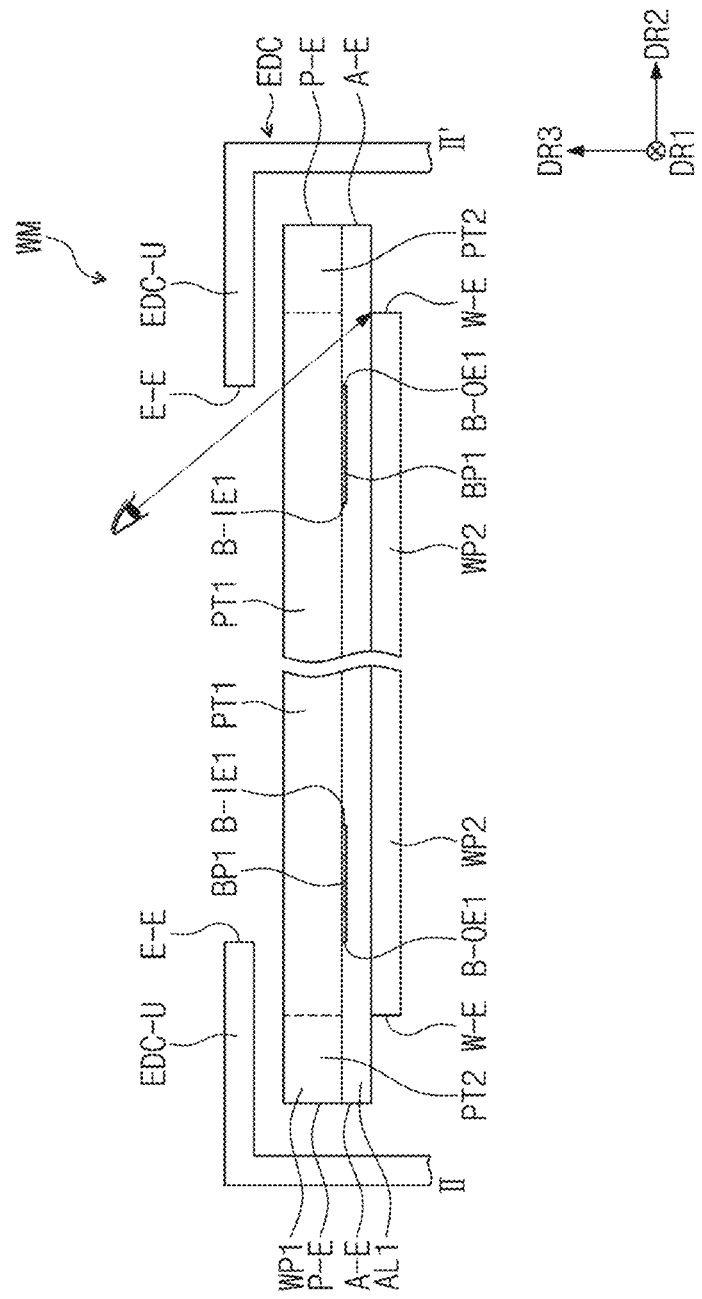
FIG. 9A is a cross-sectional view taken along line II-II' of FIG. 3 according to an embodiment of the invention.

FIG. 9A is a cross-sectional view taken along line II-IF of FIG. 3 according to an embodiment of the invention. The same or like elements shown in FIG. 9A have been labeled with the same reference characters as used above to describe the embodiments shown in FIGS. 1 to 8B, and any repetitive detailed description thereof will hereinafter be omitted or simplified.

Referring to FIGS. 3 and 9A together, FIG. 9A is a cross-sectional view of the window module WM in which the folding area FA is cut according to an embodiment of the invention. FIG. 9A illustrates a portion EDC-U of the case EDC of FIG. 3 together. The portion EDC-U of the case EDC may overlap the window module WM on the plane. A sidewall portion and an upper portion of the case EDC are illustrated. Hereinafter, the portion EDC-U will be described as the upper portion. However, the embodiment of the invention is not limited thereto, and in an alternative embodiment, the portion EDC-U of the case EDC may not overlap the window module WM on the plane. In such an embodiment, the upper portion EDC-U may be omitted, and the case EDC may be coupled from a side surface of the window module WM.

The upper portion EDC-U and the window module WM may be spaced apart from each other. In one embodiment, for example, a spaced distance may be about 20 μm or more and about 100 μm or less, for example, about 40 μm or more and about 60 μm or less. However, the embodiment of the invention is not limited thereto. In one embodiment, for example, the upper portion EDC-U and the top surface of the window module WM may be in contact with each other. Another constituent (e.g., an adhesive layer or a waterproof kit) may be further disposed between the case EDC and the top surface or the side surface of the window module An edge E-E of the upper portion EDC-U overlaps the window module WM on the plane.

The window module WM includes the first window WP1, the second window WP2 disposed under the first window WP1, and the first bezel pattern BP1. The first adhesive layer AL1 may be disposed between the first window WP1 and the second window WP2.

In the embodiment, the first bezel pattern BP1 may be disposed between the first window WP1 and the first adhesive layer AL1.

An edge A-E of the first adhesive layer AL1 may be aligned with an edge P-E of the first window WP1. In this specification, "the edge of the first component and the edge of the second component are aligned" may be understood that the edge of the first component and the edge of the second component are aligned are disposed on the same line when the edge of the first component and the edge of the second component are viewed on the plane.

The edge W-E of the second window WP2 may be disposed inwardly from the edge P-E of the first window WP1. The edge W-E of the second window WP2 may be misaligned with the edge P-E of the first window WP1 and may be misaligned with the edge A-E of the first adhesive layer AL1.

The first bezel pattern BP1 overlaps the first portion PT1 of the first window WP1. In an embodiment, an inner edge B-IE1 and an outer edge B-OE1 of the first bezel pattern BP1 may be disposed inwardly from the edge W-E of the second window WP2. The edge E-E of the upper portion EDC-U may be aligned with the outer edge B-OE1 of the first bezel pattern BP1.

The edge W-E of the second window WP2 is misaligned with the edge P-E of the first window WP1 and misaligned with the outer edge B-OE1 of the first bezel pattern BP1. The edge W-E of the second window WP2 may be disposed between the edge P-E of the first window WP1 and the outer edge B-OE1 of the first bezel pattern BP1 on the plane.

Thus, the edge W-E of the second window WP2 may be sufficiently exposed from the first bezel pattern BP1 at the outside of the window module WM. Fine cracks generated at the edge W-E of the second window WP2 may be inspected through an inspection device. The inspection device may include a microscope. The cracks starting from the edge W-E of the second window WP2 may be checked by photographing the edge W-E of the second window WP2 on the top surface of the first window WP1 through using the inspection device.

The first bezel pattern BP1 according to an embodiment of the invention is not limited thereto.

Figure 9B:
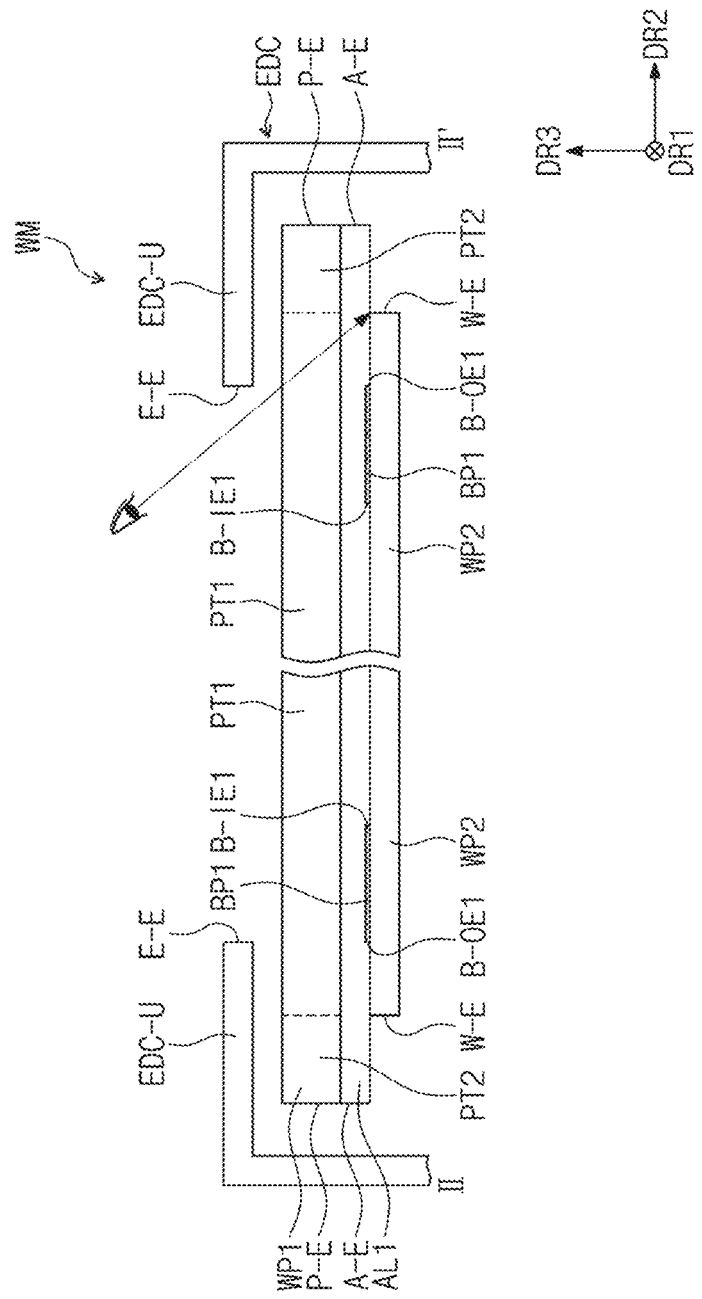
FIG. 9B is a cross-sectional view taken along line II-II' of FIG. 3 according to an alternative embodiment of the invention.

FIG. 9B is a cross-sectional view taken along line II-IF of FIG. 3 according to an alternative embodiment of the invention.

Referring to FIG. 9B, in an embodiment, the first bezel pattern BP1 may be disposed under the first adhesive layer AL1. In such an embodiment, the first bezel pattern BP1 may be disposed between the first adhesive layer AL1 and the second window WP2.

The outer edge B-OE1 of the first bezel pattern BP1 may be disposed inwardly from the edge W-E of the second window WP2. The edge W-E of the second window WP2 may be disposed between the edge P-E of the first window WP1 and the outer edge B-OE1 of the first bezel pattern BP1 on the plane. Thus, the cracks starting from the edge W-E of the second window WP2 may be checked by photographing the edge W-E of the second window WP2 on the top surface of the first window WP1 through using the inspection device.

Figure 10:
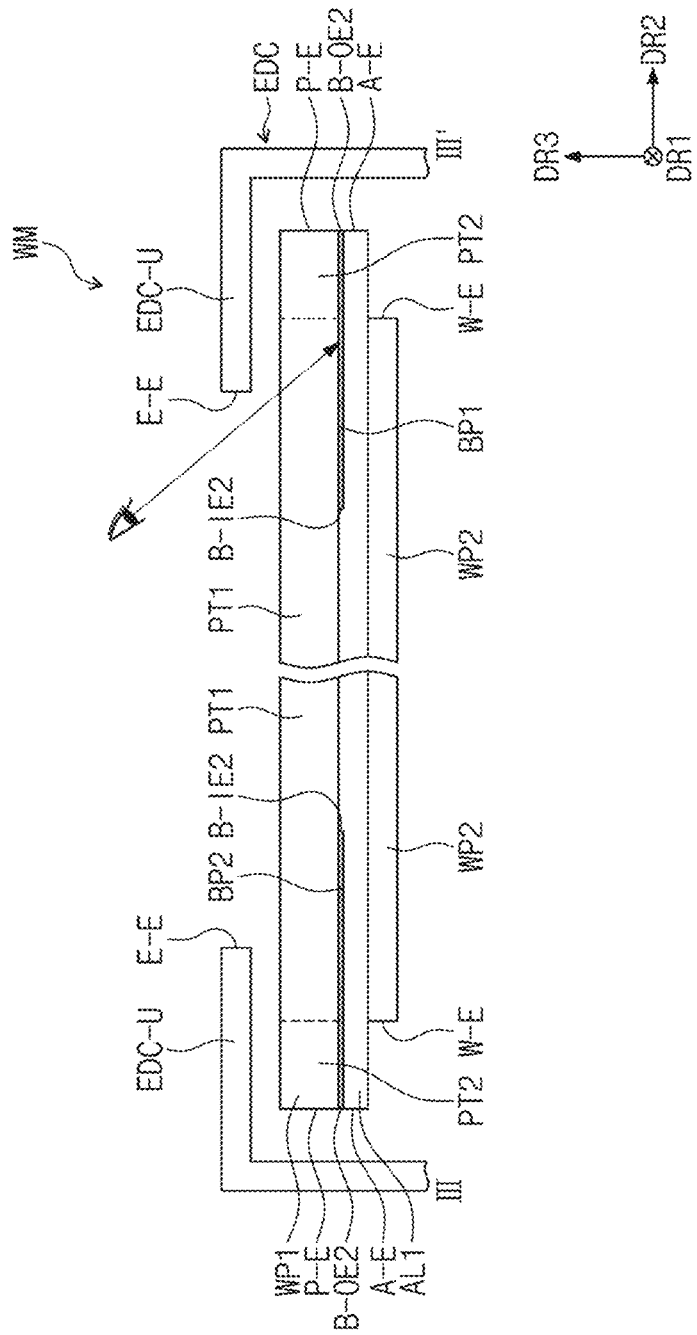
FIG. 10 is a cross-sectional view taken along line of FIG. 3 according to an embodiment of the invention.

FIG. 10 is a cross-sectional view taken along line of FIG. 3 according to an embodiment of the invention.

Referring to FIGS. 3 and 10 together, FIG. 10 is a cross-sectional view of an embodiment in which the first non-folding area NFA1 is cut in a direction parallel to the short side of the electronic device ED.

Referring to FIG. 10, the window module WM includes the first window WP1, the second window WP2 disposed under the first window WP1, and the second bezel pattern BP2. The first adhesive layer AL1 may be disposed between the first window WP1 and the second window WP2. The second bezel pattern BP2 may be disposed on the long side of the electronic device ED.

In an embodiment, the second bezel pattern BP2 may be disposed under the first window WP1, for example, between the first window WP1 and the first adhesive layer AL1. An edge A-E of the first adhesive layer AL1 may be aligned with an edge P-E of the first window WP1.

The second bezel pattern BP2 overlaps both the first portion PT1 and the second portion PT2 of the first window WP1. In an embodiment, the outer edge B-E2 of the second bezel pattern BP2 may be aligned with the edge P-E of the first window WP1. The outer edge B-OE2 of the second bezel pattern BP2 may be aligned with the edge A-E of the first adhesive layer AL1.

The edge W-E of the second window WP2 may be disposed inside the edge P-E of the first window WP1 on the plane. The edge W-E of the second window WP2 may be disposed inside the outer edge B-OE2 of the second bezel pattern BP2 on the plane view.

The edge W-E of the second window WP2 may be disposed between the outer edge B-OE2 of the second bezel pattern BP2 and the inner edge B-IE2 of the second bezel pattern BP2 on the plane. In an embodiment, the edge W-E of the second window WP2 may overlap the second bezel pattern BP2 on the plane. Thus, the edge W-E of the second window WP2 may not be visually recognized from the outside of the window module WM to improve the aesthetics of the display device DD.

As the display device DD repeats the folding operation, stress applied to the edge W-E of the second window WP2 overlapping the folding area FA may be greater than that applied to the edge W-E of the second window WP2 overlapping the non-folding areas NFA1 and NFA2. The cracks generated at the edge W-E of the second window WP2 may be generated in the folding area FA and propagated to the non-folding areas NFA1 and NFA2.

In an embodiment of the display device DD according to the invention, the edge W-E of the second window WP2 overlapping the folding area FA may be exposed from the first bezel pattern BP1, and thus, the cracks starting from the edge W-E of the second window WP2 may be checked. In such an embodiment, the edge W-E of the second window WP2 overlapping the non-folding areas NFA1 and NFA2 may overlap the second bezel pattern BP2 to excellently maintain the aesthetics of the display device DD.

The electronic device ED according to an embodiment of the invention may have improved reliability and aesthetics.

An embodiment of the second bezel pattern BP2 according the invention is not limited thereto, and in another alternative embodiment, the second bezel pattern BP2 may be disposed between the first adhesive layer AL1 and the second window WP2.

Figure 11A:
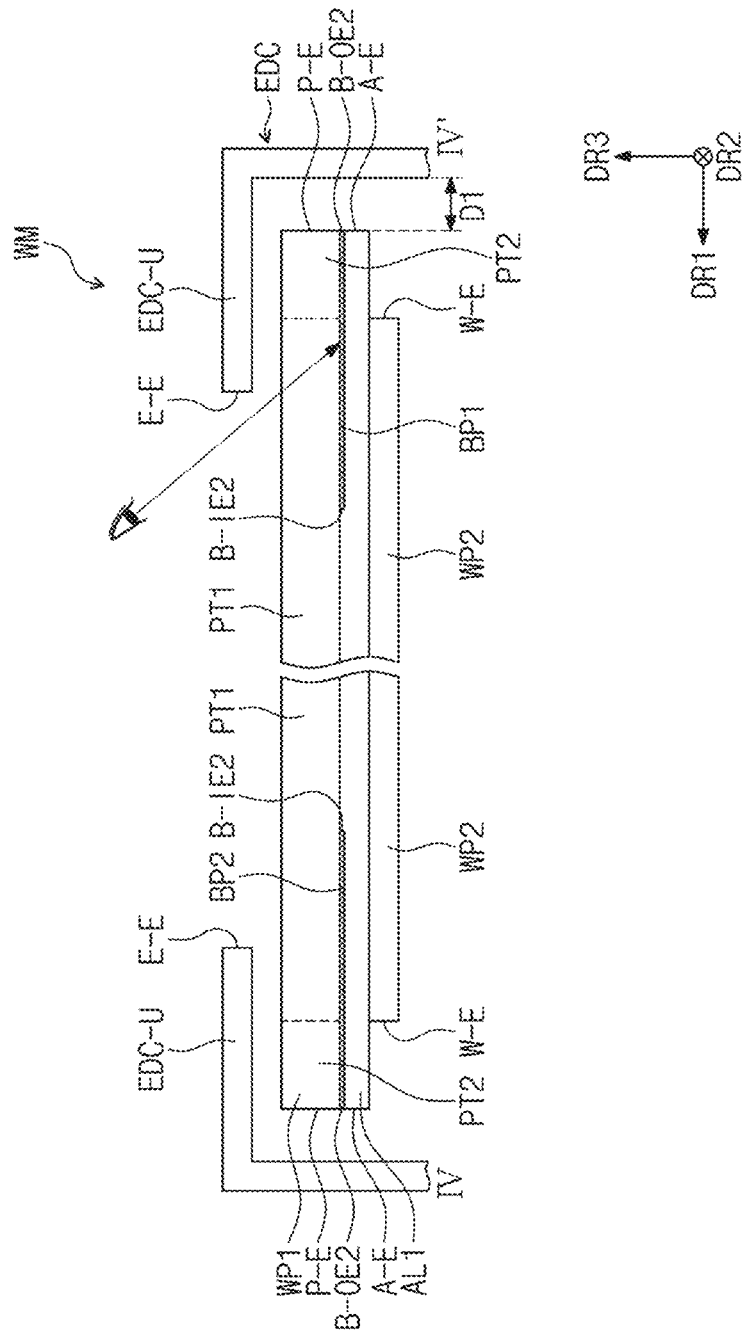
FIG. 11A is a cross-sectional view taken along line IV-IV' of FIG. 3 according to an embodiment of the invention.

FIG. 11A is a cross-sectional view taken along line IV-IV' of FIG. 3 according to an embodiment of the invention.

Referring to FIGS. 3 and 11A together, FIG. 11A is a cross-sectional view of an embodiment in which the first non-folding area NFA1 and the second non-folding area NFA2 are cut in a direction parallel to the long side of the electronic device ED.

In the state in which the electronic device ED is unfolded, the cross-section taken along line IV-IV' may have substantially the same structure as the cross-section taken along line illustrated in FIG. 10. In such an embodiment, the window module WM may include the second bezel pattern BP2 overlapping the first non-folding area NFA1 and the second non-folding area NFA2. The edge W-E of the second window WP2 may overlap the second bezel pattern BP2. Thus, the edge W-E of the second window WP2 overlapping the non-folding areas NFA1 and NFA2 may not be visually recognized from the outside of the electronic device ED. Features of the elements described with reference to FIG. 10 may be applied to the same or like other constituents in the same manner.

Figure 11B:
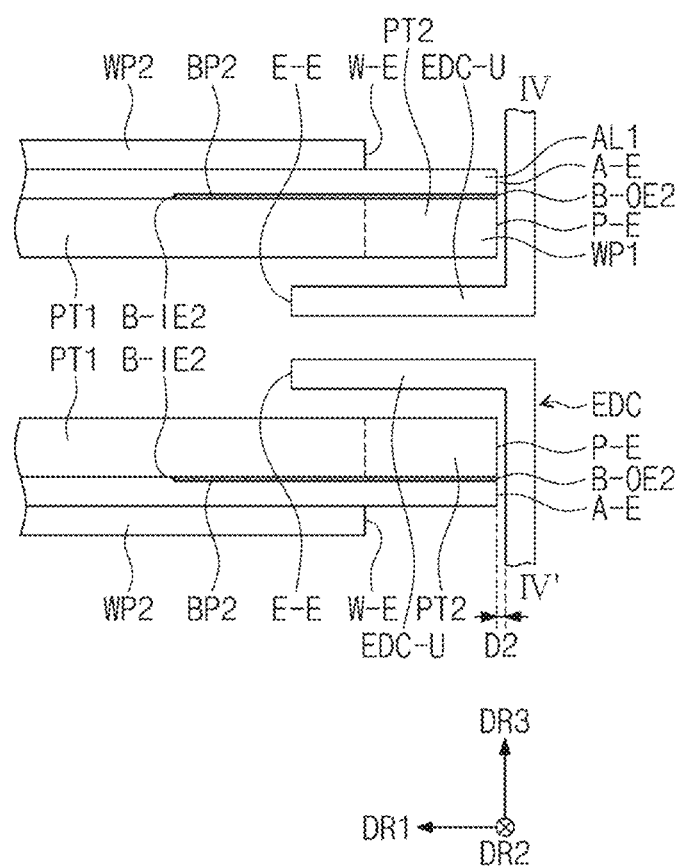
FIG. 11B is a cross-sectional view taken along line IV-IV' in a state in which the display device of FIG. 3 is folded according to an embodiment of the invention.

FIG. 11B is a cross-sectional view taken along line IV-IV' in a state in which the electronic device ED of FIG. 3 is folded according to an embodiment of the invention.

Referring to FIGS. 11A and 11B together, as the electronic device ED is folded, a distance between the first window WP1 and the case EDC may decrease. Specifically, a second distance D2 between the edge P-E of the first window WP1 and the case EDC in FIG. 11B may be less than a first distance D1 between the edge P-E of the first window WP1 and the case EDC in an unfolded stages as shown in FIG. 11A.

Referring to FIGS. 4A, 5, 11A, and 11B together, as the display device DD is folded, the window module WM disposed at the uppermost side of the display device DD may protrude forward. Specifically, as the folding area FA of the display device DD is inner-folded with respect to the folding axis FX, the folding area FA may be bent from the support part SUP, and the short sides of the display module DM and the window module WM may protrude from the short side of the support part SUP. Particularly, the window module WM disposed at the uppermost layer of the display device DD may protrude forward when the display device DD is inner-folded so that the second distance D2 between the first window WP1 and the case EDC is less than the above-described first distance D1.

In FIGS. 11A and 11B, the second bezel pattern BP2 may overlap the first and second non-folding areas NFA1 and NFA2 and may be disposed on the short side of the electronic device ED. Similar to FIG. 10, the edge W-E of the second window WP2 in the first and second non-folding areas NFA1 and NFA2 may overlap the second bezel pattern BP2 not to be visually recognized from the outside. Thus, the aesthetics of the electronic device ED may be improved.

Figure 12:
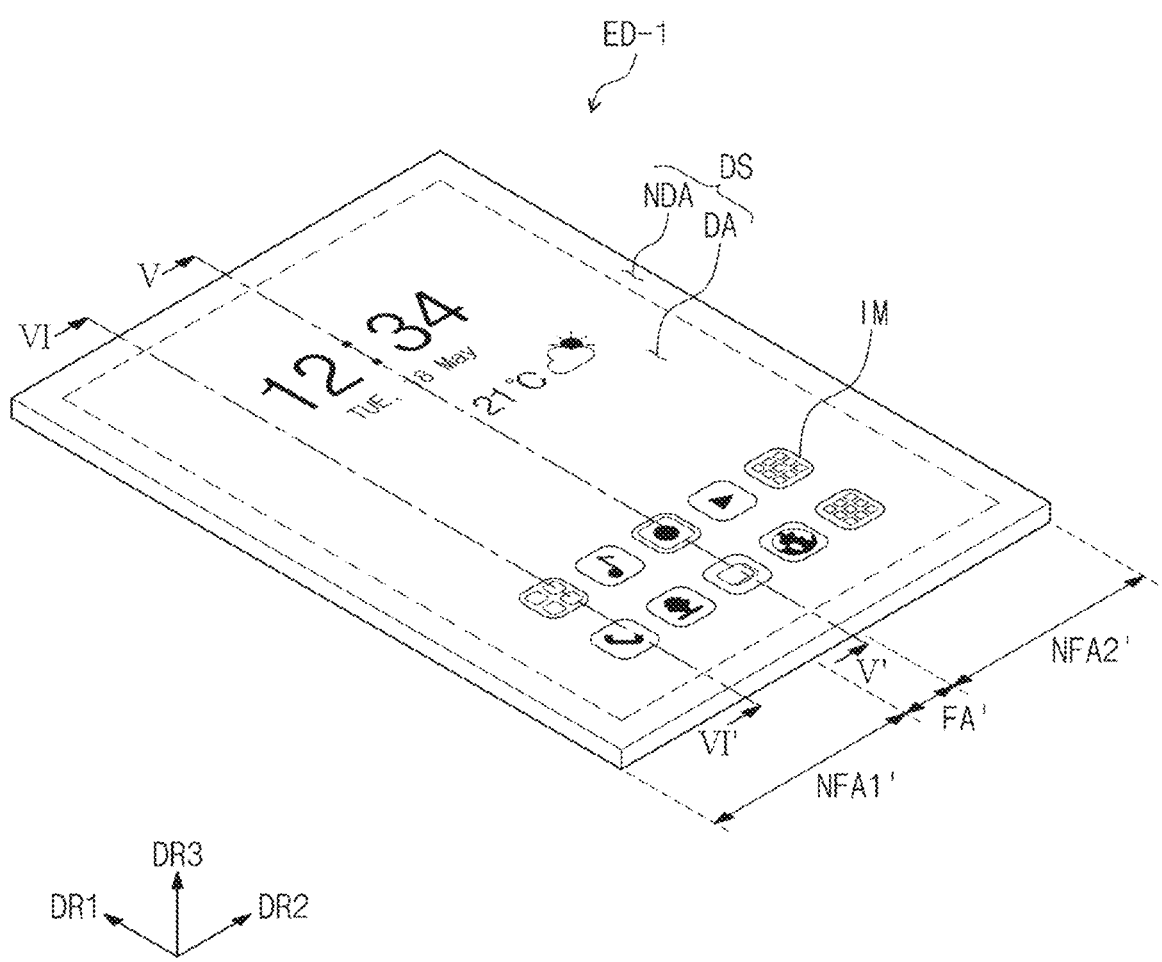
FIG. 12 is a perspective view illustrating an electronic device according to an embodiment of the invention.
Figure 13:
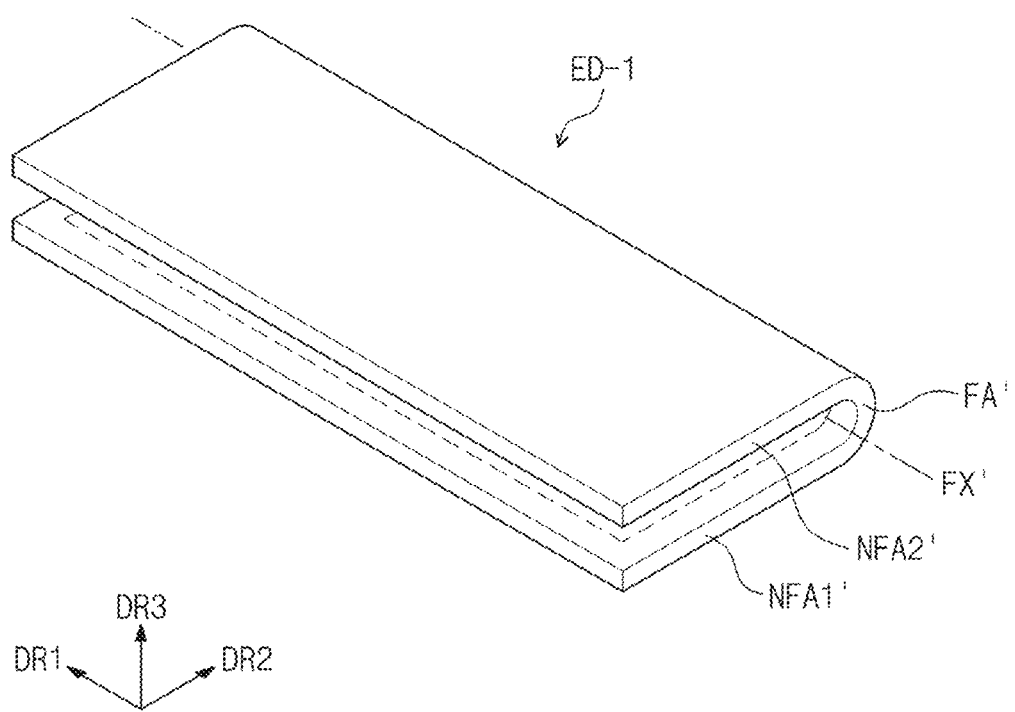
FIG. 13 is a view illustrating the electronic device of FIG. 12 in a folded state.

FIG. 12 is a perspective view illustrating an electronic device ED-1 according to an embodiment of the invention. FIG. 13 is a view illustrating the electronic device ED-1 of FIG. 12 in a folded state.

Referring to FIGS. 12 and 13, in an embodiment, a first non-folding area NFA1', a folding area FA', and a second non-folding area NFA2', which are sequentially defined in the second direction DR2, may be defined in the electronic device ED-1. The electronic device ED-1 may be folded with respect to a folding axis FX' parallel to a long side thereof. The folding axis FX' may extend in the first direction DR1. As the electronic device ED-1 is inner-folded, the first non-folding area NFA1' and the second non-folding area NFA2' may face each other, and a display surface DS may not be exposed to the outside.

Figure 14:
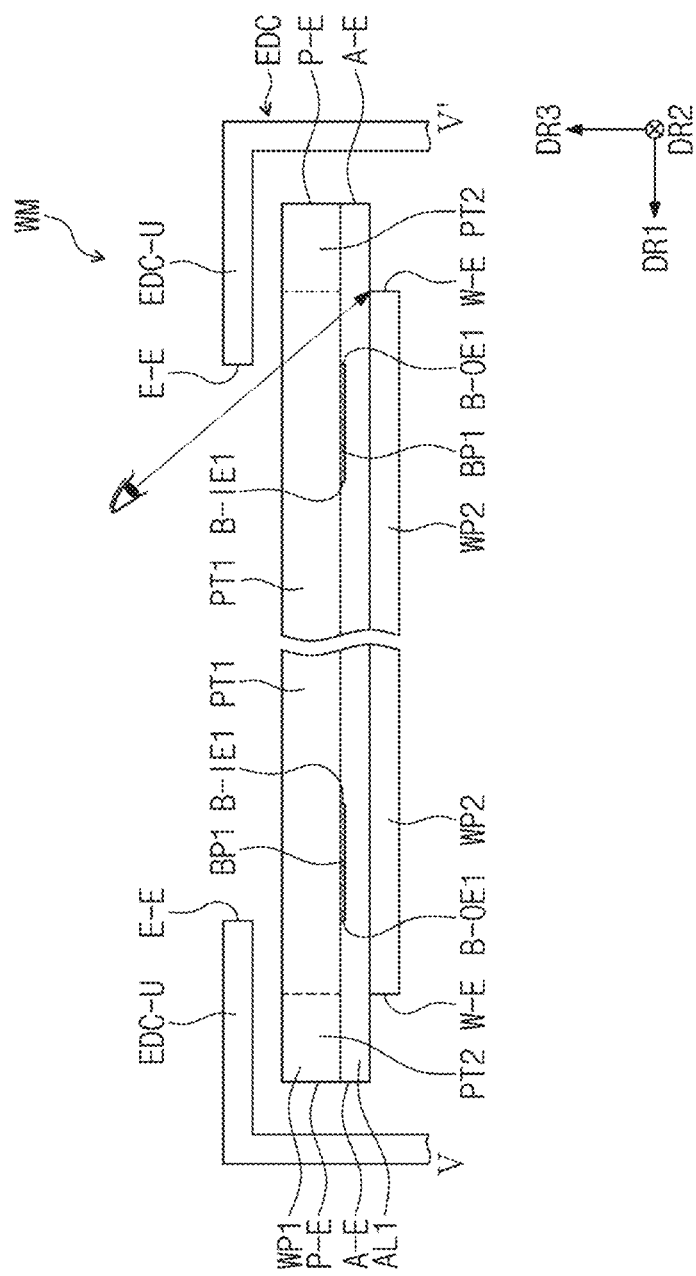
FIG. 14 is a cross-sectional view taken along line V-V' of FIG. 12 according to an embodiment of the invention.

FIG. 14 is a cross-sectional view taken along line V-V' of FIG. 12 according to an embodiment of the invention.

FIG. 14 is a cross-sectional view illustrating a state in which the folding area FA' of the electronic device ED-1 is cut according to an embodiment of the invention. Although FIG. 14 illustrates only a window module WM among constituents of the electronic device ED-1, the display module DM and the support part SUP, which are described above, may be disposed under the window module WM.

Referring to FIG. 14, a cross-section of the folding area FA' of the electronic device ED-1 may have substantially the same structure as the cross-section of the folding area FA illustrated in FIG. 9A. In such an embodiment, the window module WM may include a first bezel pattern BP1 disposed to overlap the folding area FA', and an edge W-E of the second window WP2 may be exposed from the first bezel pattern BP1. Thus, cracks of the edge W-E of the second window WP2, which overlaps the folding area FA', may be inspected from the outside of the electronic device ED-1. Features of the elements described with reference to FIG. 9A may be applied to the same or like other constituents in the same manner.

Figure 15:
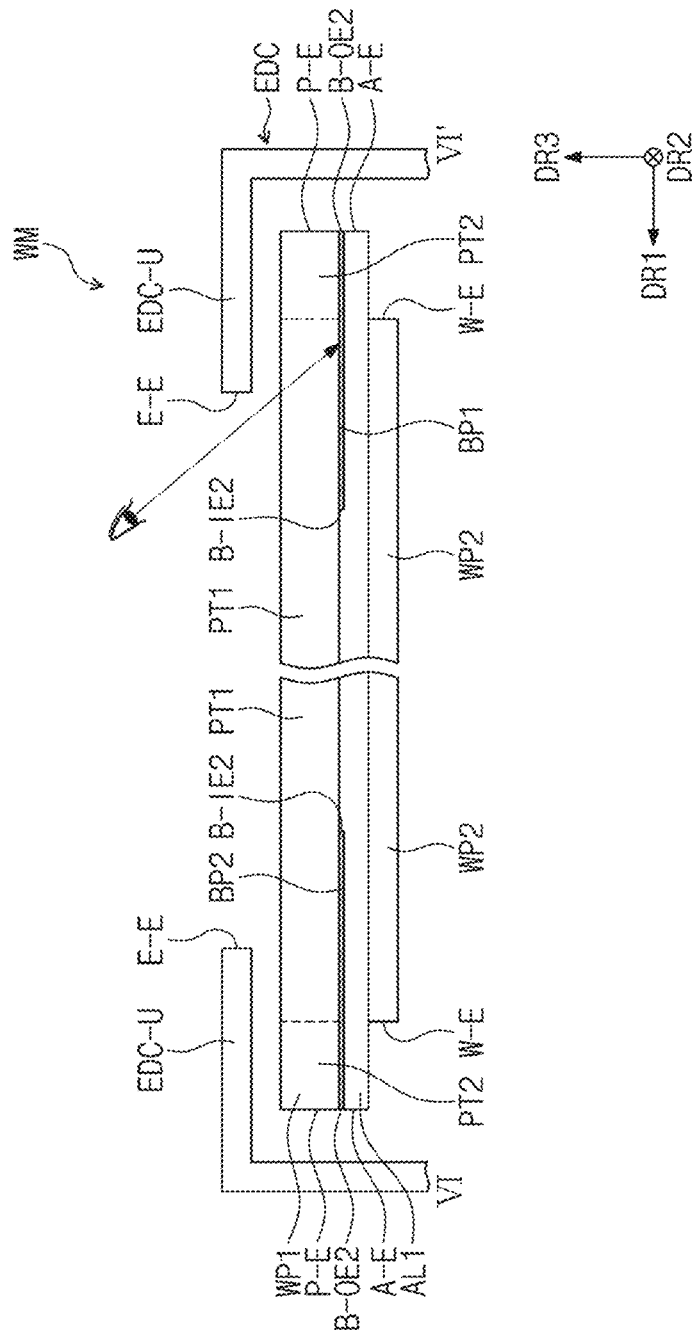
FIG. 15 is a cross-sectional view taken along line VI-VI' of FIG. 12 according to an embodiment of the invention.

FIG. 15 is a cross-sectional view taken along line VI-VI' of FIG. 12 according to an embodiment of the invention. FIG. 15 is a cross-sectional view illustrating a state in which a first non-folding area NFA1' of the electronic device ED-1 is cut according to an embodiment of the invention.

Referring to FIG. 15, a cross-section of the first non-folding area NFA1' of the electronic device ED-1 may have substantially the same structure as a cross-section of the first non-folding area NFA1 illustrated in FIG. 10.

In such an embodiment, the window module WM may include a second bezel pattern BP2 overlapping the first non-folding area NFA1'. The edge W-E of the second window WP2 may overlap the second bezel pattern BP2. Thus, the edge W-E of the second window WP2, which overlaps the first non-folding area NFA1', may not be visually recognized from the outside of the electronic device ED-1. Features of the elements described with reference to FIG. 10 may be applied to the same or like other constituents in the same manner.

Figure 16:
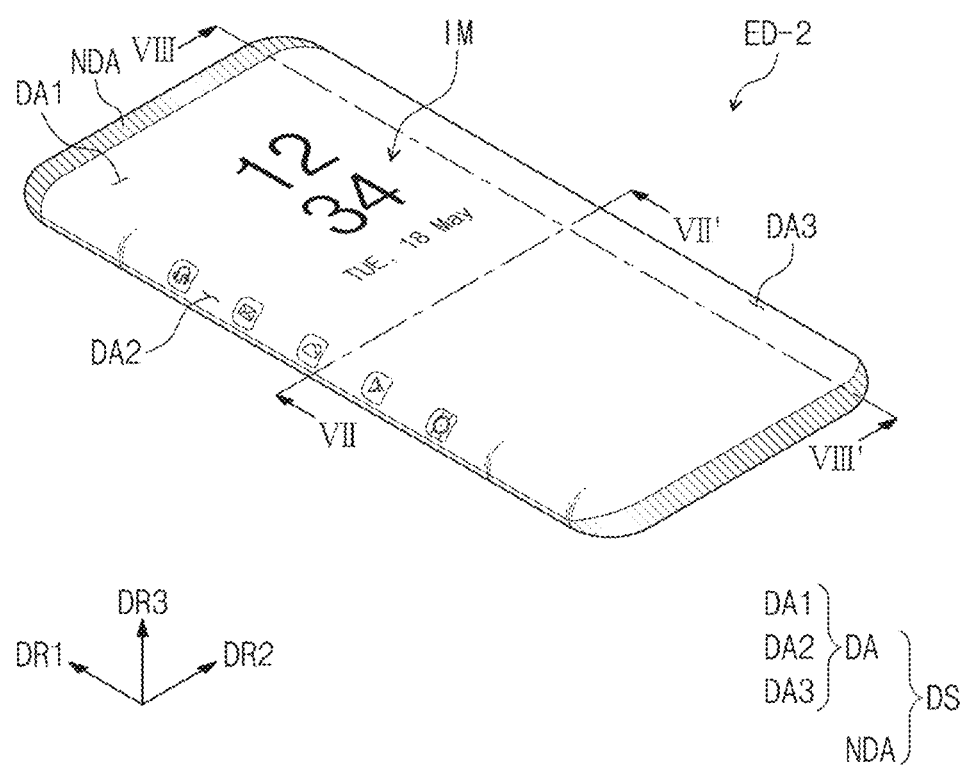
FIG. 16 is a perspective view illustrating an electronic device according to an embodiment of the invention.

FIG. 16 is a perspective view illustrating an electronic device ED-2 according to an embodiment of the invention.

Referring to FIG. 16, in an embodiment of the electronic device ED-2 according to the invention, a display surface DS may be a curved surface. Display areas DA1, DA2, and DA3 on which an image IM is displayed and a non-display area NDA may be defined on the display surface DS.

The non-display area NDA may be disposed at one side and the other side of the electronic device ED-2 and may be disposed adjacent to the display areas DA1, DA2, and DA3. However, this is merely one embodiment, and shapes of the display areas DA1, DA2, DA3 and the non-display area NDA may be variously designed.

The display areas DA1, DA2, and DA3 may include a first display area DA1, a second display area DA2, and a third display area DA3.

The first display area DA1 may be a surface parallel to a surface defined by the first direction DR1 and the second direction DR2.

The second display area DA2 may be bent from the first display area DA1 in a direction opposite to the second direction DR2. The third display area DA3 may be bent from the first display area DA1 in the second direction DR2. The second display area DA2 and the third display area DA3 may be spaced apart from each other in the second direction DR2 with the first display area DA1 therebetween. Each of the second display area DA2 and the third display area DA3 may be bent to have a predetermined curvature with respect to the first display area DA1.

The electronic device ED-2 may be improved in aesthetics by the second to third display areas DA2 and DA3, each of which is bent to have the predetermined curvature, and a surface area of the non-display area NDA recognized by the user may be reduced.

Figure 17A:
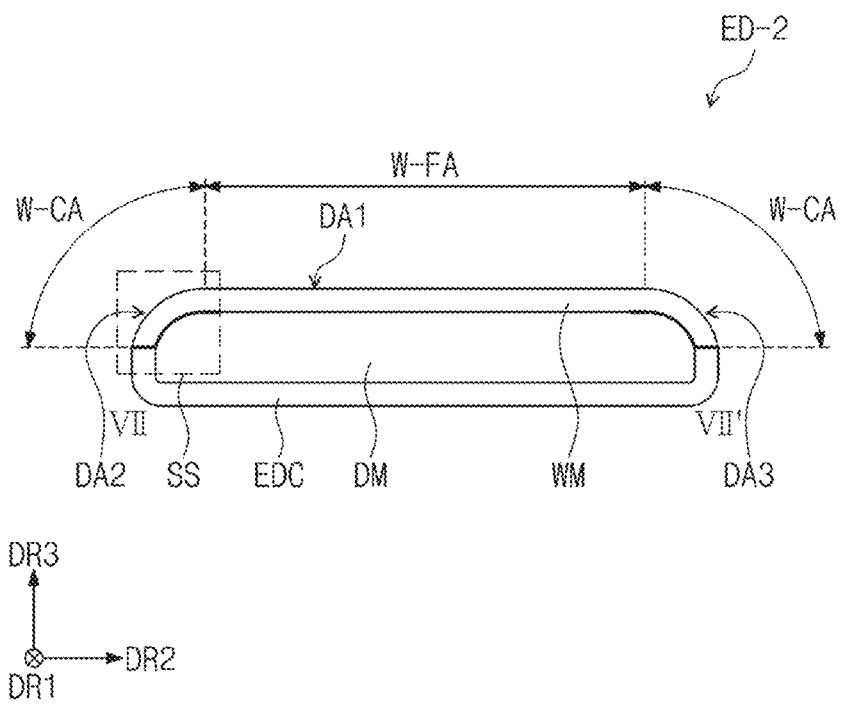
FIG. 17A is a cross-sectional view taken along line VII-VII' of FIG. 16 according to an embodiment of the invention.

FIG. 17A is a cross-sectional view taken along line VII-VII' of FIG. 16 according to an embodiment of the invention.

Referring to FIG. 17A, an embodiment of the electronic device ED-2 according to the invention includes a window module WM, a display module DM disposed under the window module WM, and a case EDC disposed under the display module DM. However, the embodiment of the invention is not limited thereto, and a support module may be disposed between the display module DM and the case EDC, and the support module may support the window module WM and the display module DM. An electronic module may be further disposed between the display module DM and the case EDC.

The case EDC may accommodate the display module DM. The case EDC may protect the display module DM from an external impact or the like at a lower side of the display module DM.

The window module WM provides a flat area W-FA corresponding to the first display area DA1 and curved areas W-CA corresponding to the second display area DA2 and the third display area DA3. The plurality of curved areas W-CA may be spaced apart from each other in the second direction DR2 with the flat area W-FA therebetween. Although FIG. 17A illustrates only one curved area W-CA, the embodiment of the invention is not limited thereto, and the window module WM according to an embodiment of the invention may include a plurality of curved areas W-CA spaced apart from each other with the flat area W-FA therebetween.

Features of the elements described above may be applied to the same or like other constituents in the same manner.

Figure 17B:
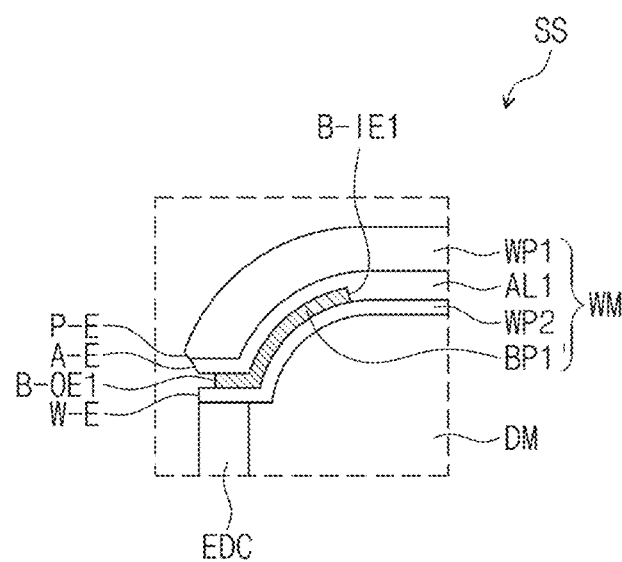
FIG. 17B is an enlarged cross-sectional view of an area SS of FIG. 17A according to an embodiment of the invention.

FIG. 17B is an enlarged cross-sectional view of an area SS of FIG. 17A according to an embodiment of the invention.

Referring to FIG. 17B, an area SS may be an enlarged cross-sectional view of the curved area W-CA of the window module WM. The first bezel pattern BP1' may be disposed on at least a portion of the curved area W-CA of the window module WM.

In an embodiment, the first adhesive layer AL1 may be disposed between the first window WP1 and the second window WP2. The first bezel pattern BP1' may be disposed between the first adhesive layer AL1 and the second window WP2.

An edge A-E of the first adhesive layer AL1 may be aligned with an edge P-E of the first window WP1.

The edge W-E of the second window WP2 may be disposed inside the edge P-E of the first window WP1 on the plane.

An outer edge B-OE1 and an inner edge B-IE1 of the first bezel pattern BP1' may be disposed inside an edge W-E of the second window WP2.

The edge W-E of the second window WP2 may be disposed between the outer edge B-OE1 of the first bezel pattern BP1' and the edge P-E of the first window WP1, and thus, the edge W-E of the second window WP2 may be visually recognized from the outside.

Thus, in the electronic device ED-2 of the invention, the edge W-E of the second window WP2 may inspect from the outside to check whether cracks occur.

Figure 18:
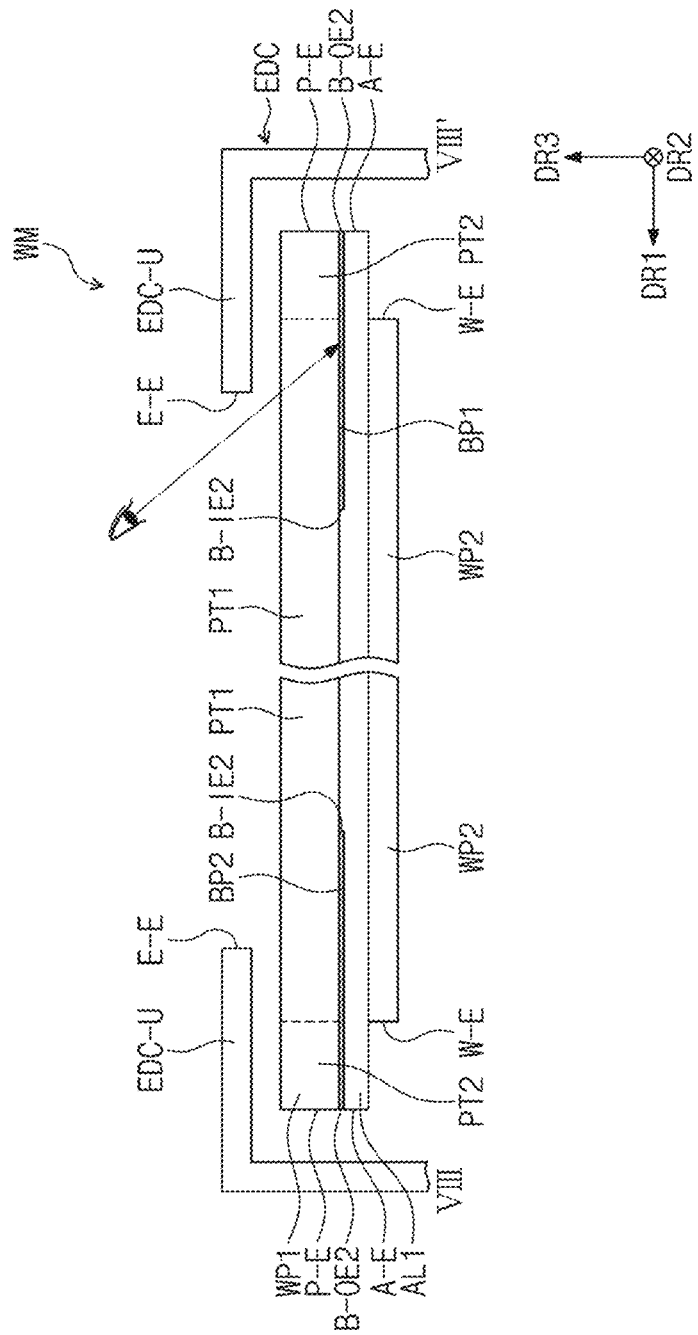
FIG. 18 is a cross-sectional view taken along line VIII-VIII' of FIG. 16 according to an embodiment of the invention.

FIG. 18 is a cross-sectional view taken along line VIII-VIII' of FIG. 16 according to an embodiment of the invention.

Referring to FIG. 18, a second bezel pattern BP2 may be disposed in the non-display area NDA of the electronic device ED-2 according to an embodiment of the invention. A cross-section of the non-display area NDA, which is illustrated in FIG. 18, may have the same structure as the cross-section of the first non-folding area NFA1, which is illustrated in FIG. 10.

That is, in the non-display area NDA of the electronic device ED-2 according to an embodiment of the invention, the edge W-E of the second window WP2 may overlap the second bezel pattern BP2. Thus, the edge W-E of the second window WP2, which overlaps the non-display area NDA, may not be visually recognized from the outside of the electronic device ED-2. Thus, the aesthetics of the non-display area NDA of the electronic device ED-2 may be improved. Features of the elements described with reference to FIG. 10 may be applied to the same or like other constituents in the same manner.

An embodiment of the electronic device ED-2 according to the invention may include a curved area W-CA on at least a portion of the display areas DA1, DA2, and DA3. In the curved area W-CA, the edge W-E of the second window WP2 is exposed from the first bezel pattern BP1'. Thus, the edge W-E of the second window WP2, which overlaps the curved area W-CA, may be inspected from the outside of the electronic device ED-2 to check whether the cracks occur.

An embodiment of the electronic device according to the invention includes a first bezel pattern and a second bezel pattern, which are disposed between a first window and a second window. Here, the first bezel pattern overlaps the folding area, and the second bezel pattern overlaps the non-folding area. The first bezel pattern is disposed inside the edge of the second window, and the second bezel pattern overlaps the edge of the second window. Thus, in an embodiment of the electronic device according to the invention, a portion of the edge of the second window, which overlaps the folding area, is visually recognized from the outside.

In an embodiment of the electronic device according to the invention, the portion of the edge of the second window, which overlaps the folding area, may be visually recognized from the outside, and thus the cracks starting from the edge of the second window may be inspected.

According to embodiment of the invention, whether the window is damaged may be inspected from the outside of the display device while maintaining the aesthetics of the display device.

According to embodiment of the invention, the electronic device may be improved in reliability.

In embodiment of the electronic device according to the invention, the portion of the edge of the second window, which overlaps the non-folding area, may not be visually recognized from the outside. Thus, the aesthetics of the electronic device may be improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a display module on which a display area and a non-display area are defined; and
   a window module disposed on the display module,
   wherein the window module comprises:
   a first window;
   a second window disposed under the first window; and
   a bezel pattern overlapping the non-display area,
   wherein, when viewed from a plan view in a thickness direction of the display device, at least a portion of an edge of the second window does not overlap the bezel pattern, and
   wherein, the second window disposed under the first window.

2. The display device of claim 1, wherein the first window has a length greater than a length of the second window in a first direction.

3. The display device of claim 1, wherein
   a folding area and a non-folding area are defined on the display module,
   the bezel pattern comprises a first bezel pattern overlapping the folding area and a second bezel pattern overlapping the non-folding area, and
   when viewed from the plan view in the thickness direction of the display device, the first bezel pattern does not overlap the edge of the second window, and the second bezel pattern overlaps the edge of the second window.

4. The display device of claim 3, wherein the first bezel pattern has a width less than a width of the second bezel pattern.

5. The display device of claim 3, wherein the first bezel pattern and the second bezel pattern are integrally formed with each other as a single unitary unit.

6. The display device of claim 3, wherein
   the first bezel pattern comprises a first outer edge and a first inner edge,
   the second bezel pattern comprises a second outer edge and a second inner edge, and
   when viewed from the plan view in the thickness direction of the display device, the first inner edge and the second inner edge are disposed inwardly from the edge of the second window.

7. The display device of claim 6, wherein
   when viewed from the plan view in the thickness direction of the display device, the first outer edge is disposed inwardly from the edge of the second window, and
   when viewed from the plan view in the thickness direction of the display device, the second outer edge is disposed outwardly from the edge of the second window.

8. The display device of claim 1, wherein the bezel pattern is disposed between the first window and the second window.

9. The display device of claim 1, further comprising:
   an adhesive layer disposed between the first window and the second window.

10. The display device of claim 9, wherein the bezel pattern is disposed between the first window and the adhesive layer.

11. The display device of claim 9, wherein the bezel pattern is disposed between the adhesive layer and the second window.

12. The display device of claim 1, wherein the second window has a thickness in a range of about 15 μm to about 100 μm.

13. The display device of claim 1, wherein the first window comprises at least one selected from polyimide, polyethylene, polyurethane, and cellulose triacetate.

14. The display device of claim 1, wherein the second window comprises a chemically tempered glass substrate.

15. The display device of claim 1, further comprising:
   a support part disposed under the display module,
   wherein the support part comprises:
   a metal layer disposed under the display module;
   a cover layer disposed under the metal layer;

a step compensation layer disposed under the cover layer; and a heat dissipation layer disposed under the step compensation layer.

16. A display device comprising:

a display module on which a folding area and a non-folding area are defined;

a window protection layer disposed on the display module;

a window base layer disposed between the window protection layer and the display module; and a bezel pattern disposed under the window protection layer, wherein the bezel pattern comprises a first bezel pattern overlapping the folding area and a second bezel pattern overlapping the non-folding area, and when viewed from a plan view in a thickness direction of the display device, the first bezel pattern does not overlap an edge of the window base layer, and the second bezel pattern overlaps the edge of the window base layer.

17. The display device of claim 16, wherein the window protection layer comprises:

a first portion which overlaps the window base layer when viewed from the plan view in the thickness direction of the display device; and a second portion which extends from the first portion and does not overlap the base layer when viewed from the plan view in the thickness direction of the display device, wherein the first bezel pattern overlaps the first portion and does not overlap the second portion when viewed from the plan view in the thickness direction of the display device, and the second bezel pattern overlaps the first portion and the second portion when viewed from the plan view in the thickness direction of the display device.

18. A display device comprising:

a display module on which a folding area and a non-folding area are defined;

a window module disposed on the display module, wherein the window module comprises:

a window protection layer;

a bezel pattern disposed under the window protection layer; and a thin film glass substrate disposed under the bezel pattern, wherein the window protection layer comprises:

a first portion overlapping the thin film glass substrate when viewed from a plan view in a thickness direction of the display device; and a second portion which extends from the first portion and does not overlap the thin film glass substrate when viewed from the plan view in the thickness direction of the display device, wherein the bezel pattern comprises:

a first bezel pattern overlapping the first portion and the folding area when viewed from the plan view in the thickness direction of the display device; and a second bezel pattern overlapping the first portion, the second portion, and the non-folding area when viewed from the plan view in the thickness direction of the display device.

19. The display device of claim 18, wherein the first bezel pattern comprises a first outer edge and a first inner edge, the second bezel pattern comprises a second outer edge and a second inner edge, and when viewed from the plan view in the thickness direction of the display device, the first inner edge is aligned with the second inner edge.

20. The display device of claim 19, wherein when viewed from the plan view in the thickness direction of the display device, the first outer edge is disposed inwardly from an edge of the thin film glass substrate, and when viewed from the plan view in the thickness direction of the display device, the second outer edge is aligned with an edge of the window protection layer.

21. An electronic device comprising:

a display device comprising a first signal area, through which an optical signal passes, and a display area adjacent to the first signal area; and an electronic module disposed under the display device and overlapping the first signal area, wherein the electronic module receives the optical signal, wherein the display device comprises:

a display module on which a display area and a non-display area are defined; and a window module disposed on the display module, wherein the window module comprises:

a first window;

a second window disposed under the first window; and a bezel pattern overlapping the non-display area, wherein, when viewed from a plan view in a thickness direction of the display device, at least a portion of an edge of the second window does not overlap the bezel pattern.

22. The electronic device of claim 21, wherein the electronic module comprises at least one selected from a camera module and a sensor module.

23. The electronic device of claim 21, wherein a first non-folding area, a second non-folding area, and a folding area disposed between the first non-folding area and the second non-folding area are defined in the display module, the bezel pattern comprises a first bezel pattern overlapping the folding area and a second bezel pattern overlapping the first non-folding area or the second non-folding area, and when viewed from the plan view in the thickness direction of the display device, the first bezel pattern does not overlap the edge of the second window, and the second bezel pattern overlaps the edge of the second window.

24. The electronic device of claim 23, wherein the first bezel pattern has a width less than a width of the second bezel pattern.

25. The electronic device of claim 23, wherein the first bezel pattern comprises a first outer edge and a first inner edge, the second bezel pattern comprises a second outer edge and a second inner edge, and when viewed from the plan view in the thickness direction of the display device, the first inner edge and the second inner edge are disposed inwardly from the edge of the second window.

26. The electronic device of claim 25, wherein when viewed from the plan view in the thickness direction of the display device, the first outer edge is disposed inwardly from the edge of the second window, and when viewed from the plan view in the thickness direction of the display device, the second outer edge is disposed outwardly from the edge of the second window.

\* \* \* \* \*